United States Patent
Sasaki

(10) Patent No.: US 10,199,570 B2
(45) Date of Patent: Feb. 5, 2019

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/554,089

(22) PCT Filed: Mar. 29, 2016

(86) PCT No.: PCT/JP2016/060056
§ 371 (c)(1),
(2) Date: Aug. 28, 2017

(87) PCT Pub. No.: WO2016/158923
PCT Pub. Date: Oct. 6, 2016

(65) Prior Publication Data
US 2018/0040815 A1 Feb. 8, 2018

(30) Foreign Application Priority Data

Mar. 31, 2015 (JP) .................................. 2015-071409

(51) Int. Cl.
*H01L 43/08* (2006.01)
*G01R 33/09* (2006.01)
(Continued)

(52) U.S. Cl.
CPC .............. *H01L 43/08* (2013.01); *G01R 33/09* (2013.01); *G01R 33/098* (2013.01); *G11B 5/39* (2013.01);
(Continued)

(58) Field of Classification Search
CPC ....... H01L 43/08; H01L 43/10; H01L 27/222; H01L 27/224; H01L 29/66984;
(Continued)

(56) References Cited

U.S. PATENT DOCUMENTS

| | | |
|---|---|---|
| 2009/0097168 A1 | 4/2009 | Inomata et al. |
| 2011/0143166 A1 | 6/2011 | Kawakami et al. |

(Continued)

FOREIGN PATENT DOCUMENTS

| | | |
|---|---|---|
| JP | 2013-175615 A | 9/2013 |
| JP | 5586028 B2 | 9/2014 |

(Continued)

OTHER PUBLICATIONS

Sukegawa, Hiroaki et al., "Tunnel magnetoresistance with improved bias voltage dependence in lattice-matched Fe/spinel MgAl2O4/Fe(001) junctions," Applied Physics Letter, 2010, vol. 96, pp. 212505-1-212505-3.

(Continued)

*Primary Examiner* — Bac Au
(74) *Attorney, Agent, or Firm* — Oliff PLC

(57) ABSTRACT

A magnetoresistance effect element has a first ferromagnetic metal layer, a second ferromagnetic metal layer, and a tunnel barrier layer that is sandwiched between the first and second ferromagnetic metal layers, and a tunnel barrier layer that is sandwiched between the first and second ferromagnetic metal layers, the tunnel barrier layer is expressed by a composition formula of $AB_2O_x$ ($0<x\leq4$), and has a spinel structure in which cations are arranged in a disordered manner, the tunnel barrier layer has a lattice-matched portion and a lattice-mismatched portion, A is a divalent cation of plural non-magnetic elements, B is an aluminum ion, and in the composition formula, the number of the divalent cation is smaller than half the number of the aluminum ion.

17 Claims, 14 Drawing Sheets

(51) Int. Cl.

| | |
|---|---|
| *G11B 5/39* | (2006.01) |
| *H01F 10/14* | (2006.01) |
| *H01F 10/16* | (2006.01) |
| *H01F 10/26* | (2006.01) |
| *H01F 10/32* | (2006.01) |
| *H01L 43/10* | (2006.01) |
| *H01L 27/105* | (2006.01) |
| *H01L 29/82* | (2006.01) |

(52) U.S. Cl.
CPC ............ *H01F 10/14* (2013.01); *H01F 10/16* (2013.01); *H01F 10/26* (2013.01); *H01F 10/32* (2013.01); *H01F 10/324* (2013.01); *H01L 27/105* (2013.01); *H01L 29/82* (2013.01); *H01L 43/10* (2013.01)

(58) Field of Classification Search
CPC ....... H01L 29/82; B82Y 25/00; G11C 11/161; G11C 11/1675; G11C 11/5607; G11C 19/0808; G11C 11/16; G11C 13/0069; H01F 10/3254; H01F 10/1936; H01F 10/3268; H01F 10/3286; G01R 33/093; G01R 33/098; G11B 5/3909; G11B 2005/3996; G11B 5/3906; G11B 5/3929; Y10T 428/1107

See application file for complete search history.

(56) References Cited

U.S. PATENT DOCUMENTS

| | | | |
|---|---|---|---|
| 2012/0091548 | A1 | 4/2012 | Sukegawa et al. |
| 2013/0221461 | A1 | 8/2013 | Sukegawa et al. |
| 2014/0301136 | A1 | 10/2014 | Inokuchi et al. |
| 2015/0357016 | A1 | 12/2015 | Inokuchi et al. |
| 2017/0170392 | A1* | 6/2017 | Sasaki ................ G01R 33/098 |

FOREIGN PATENT DOCUMENTS

| | | |
|---|---|---|
| JP | 2014-203931 A | 10/2014 |
| JP | 2015-061043 A | 3/2015 |
| WO | 2007/126071 A1 | 11/2007 |
| WO | 2009/157100 A1 | 12/2009 |
| WO | 2013/099740 A1 | 7/2013 |

OTHER PUBLICATIONS

Scheike, Thomas et al., "Lattice-matched magnetic tunnel junctions using a Heusler alloy Co2FeAl and a cation-disorder spinel Mg—Al—O barrier," Applied Physics Letter, 2014, vol. 105, pp. 242407-1-242407-5.

Miura, Yoshio et al., "First-principles study of tunneling magnetoresistance in Fe/MgAl2O4/Fe(001) magnetic tunnel junctions," Physical Review B, 2012, vol. 86, pp. 024426-1-024426-6.

Jun. 21, 2016 International Search Report issued in International Patent Application No. PCT/JP2016/060056.

* cited by examiner

← OXYGEN ATOM

← CATIONIC ATOM

← OXYGEN ATOM

← CATIONIC ATOM

MAGNETORESISTANCE EFFECT ELEMENT

TECHNICAL FIELD

The present invention relates to a magnetoresistance effect element.

Priority is claimed on Japanese Patent Application No. 2015-071409, filed on Mar. 31, 2015, the content of which is incorporated herein by reference.

BACKGROUND ART

Giant magnetoresistance (GMR) elements formed of a multilayer film consisting of a ferromagnetic layer and a non-magnetic layer, and tunnel magnetoresistance (TMR) elements using an insulating layer (a tunnel barrier layer or a barrier layer) as a non-magnetic layer have been known. In general, TMR elements have higher element resistance than GMR elements, but a magnetoresistance (MR) ratio of the TMR elements is higher than that of the GMR elements. The TMR elements can be divided into two types. One type is related to TMR elements using only a tunneling effect using an effect of soaking-out of a wave function between ferromagnetic layers. The other type is related to TMR elements using coherent tunneling using conduction in a specific orbit of a non-magnetic insulating layer where tunneling is carried out when the above-described tunneling effect is caused. TMR elements using coherent tunneling have been known to obtain a higher MR ratio than TMR elements using only tunneling. The coherent tunneling effect is caused in a case where both of the ferromagnetic layer and the non-magnetic insulating layer are crystalline and an interface between the ferromagnetic layer and the non-magnetic insulating layer is crystallographically continuous.

Magnetoresistance effect elements are used for various purposes. For example, magnetoresistance effect-type magnetic sensors have been known as magnetic sensors, and magnetoresistance effect elements determine characteristics of a reproducing function of hard disk drives. These detect, as a resistance change of a magnetoresistance effect element, an effect that a magnetization direction of the magnetoresistance effect element is changed by an external magnetic field. Highly anticipated devices are magnetoresistance change-type random access memories (MRAM). MRAMs are memories that read magnetoresistance as digital signals of 0 and 1 by appropriately changing ferromagnetic magnetization directions of two layers to parallel or antiparallel directions.

LITERATURE

Patent Documents

[Patent Document 1] Japanese Patent No. 5586028
[Patent Document 2] Japanese Unexamined Patent Application, First Publication No. 2013-175615

Non-Patent Documents

[Non Patent Document 1] Hiroaki Sukegawa, a [1] Huixin Xiu, Tadakatsu Ohkubo, Takao Furubayashi, Tomohiko Niizeki, Wenhong Wang, Shinya Kasai, Seiji Mitani, Koichiro Inomata, and Kazuhiro Hono, APPLIED PHYSICS LETTERS 96, 212505 [1] (2010)
[Non Patent Document 2] Thomas Scheike, Hiroaki Sukegawa, Takao Furubayashi, Zhenchao Wen, Koichiro Inomata, Tadakatsu Ohkubo, Kazuhiro Hono, and Seiji Mitani, Applied Physics Letters, 105,242407 (2014)
[Non Patent Document 3] Yoshio Miura, Shingo Muramoto, Kazutaka Abe, and Masafumi Shirai, Physical Review B 86, 024426 (2012)

DISCLOSURE OF INVENTION

Problem to be Solved by Invention

In recent years, it has been required to use MgO as a non-magnetic insulating layer in order to cause the coherent tunneling. However, in a case where MgO is used as a non-magnetic insulating layer, there is a problem in that the MR ratio is significantly reduced in a case where a bias voltage to be applied to a TMR element is increased.

Future devices such as magnetic sensors and MRAMs are required to obtain a sufficiently high MR ratio even at a high bias voltage. An index for a reduction in the MR ratio at a bias voltage is $V_{half}$. $V_{half}$ refers to a bias voltage at which the MR ratio at the time of applying a low bias voltage is reduced by half with reference to the low bias voltage. The low bias voltage is, for example, 1 mV. Since an optimum low bias voltage to be obtained varies depending on conditions such as a resistance value of the magnetoresistance effect element, the low bias voltage may be equal to or lower than at least $1/10$ of $V_{half}$.

In a magnetic sensor, an electrical signal obtained as a resistance change in a circuit should be amplified in order to observe a minute magnetic field such as geomagnetism or biomagnetism. In order to realize higher sensitivity than conventional sensors, as well as the MR ratio, an output voltage or an output current is also required to be increased, and driving at a high bias voltage is also required. In a case of MRAM, high-voltage driving is required in a write operation. In spin transfer torque-type (STT) MRAMs, the more the magnetization direction of a ferromagnetic layer changes, the higher current density is required to be applied to the magnetoresistance effect element. The magnetization direction of a ferromagnetic layer is an effect of the action of a spin-polarized current on the spin of the ferromagnetic layer. Similarly to the MR ratio, a rewrite current is generated by a strong spin-polarized current, and thus a high MR ratio is similarly required at a high bias voltage in STT-MRAMs.

In Patent Document 1 and Non-Patent Document 1, a tunnel barrier having a spinel structure is reported to be effective as a substituent material for MgO. A spinel tunnel barrier expressed by a composition formula of $MgAl_2O_4$ has been known to obtain the same MgO ratio as MgO, and to obtain a higher MR ratio than MgO at a high bias voltage. In addition, in Patent Document 2 and Non-Patent Documents 2 and 3, there is a description that $MgAl_2O_4$ is required to have a disordered spinel structure in order to obtain a high MR ratio. The above-described disordered spinel structure denotes a structure where oxygen atoms are arranged in cubic close-packed lattice that is substantially similar to spinel lattice, the structure as a whole belongs to a cubic structure, but arrangement of magnesium and aluminum atoms are disordered. In an original ordered spinel, Mg and Al are arranged in order in the tetrahedral vacancies and octahedral vacancies in the original spinel. However, since these are arranged in random arrangement in the disordered spinel structure, the crystal symmetry of the structure is different from $MgAl_2O_4$, and the lattice constant of the structure is substantially half of 0.808 nm of $MgAl_2O_4$.

The invention is contrived in view of the above-described circumstances, and an object thereof is to provide a magnetoresistance effect element that obtains a higher MR ratio than a TMR element using a conventional spinel tunnel barrier at a high bias voltage.

Means for Solving the Problems

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, the tunnel barrier layer is expressed by a composition formula of $AB_2O_x$ (0<x≤4), and has a spinel structure in which cations are arranged in a disordered manner, A is a divalent cation of plural non-magnetic elements, B is an aluminum ion, and in the composition formula, the number of the divalent cation is smaller than half the number of the aluminum ion.

In the tunnel barrier layer having a spinel structure in which cations are disordered, in a case where a different non-magnetic element is disposed in a divalent cation site, the basic lattice constant becomes half the lattice constant of a conventional spinel structure, and the MR ratio is increased. By making the number of constituent elements of the non-magnetic element smaller than half the number of elements of the aluminum ion, holes are generated in the cations, the holes and two or more types of non-magnetic elements occupy the cations, and thus lattice periodicity is disturbed. Accordingly, the MR ratio is further increased. In addition, this $V_{half}$ is 1 V or greater, and the magnetoresistance effect element can also be used in devices to which a high bias voltage is applied, such as high-sensitivity magnetic sensors, logic-in-memories, and MRAMs.

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, the tunnel barrier layer is expressed by a composition formula of $AB_2O_x$ (0<x≤4), and has a spinel structure in which cations are arranged in a disordered manner, the tunnel barrier layer has a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer, A is a divalent cation of plural non-magnetic elements, B is an aluminum ion, and in the composition formula, the number of elements of the divalent cation is smaller than half the number of elements of the aluminum ion.

In the tunnel barrier layer having a spinel structure in which cations are disordered, in a case where a different non-magnetic element is disposed in a divalent cation site, the basic lattice constant becomes half the lattice constant of a conventional spinel structure, and the MR ratio is increased. Furthermore, in the tunnel barrier layer, lattice-matched parts, which are lattice-matched with both of a first ferromagnetic metal layer and a second ferromagnetic metal layer, partially exist. In general, the tunnel barrier layer may be completely lattice-matched to both of the first ferromagnetic metal layer and the second ferromagnetic metal layer. However, in a case where the tunnel barrier layer is completely lattice-matched, spin-polarized electrons interfere with each other while passing through the tunnel barrier layer, and thus the electrons do not easily pass through the tunnel barrier layer. In contrast, in a case where the tunnel barrier layer has a lattice-matched portion that is lattice-matched with both of the first ferromagnetic metal layer and the second ferromagnetic metal layer and a lattice-mismatched portion that is not lattice-matched with at least one of the first ferromagnetic metal layer and the second ferromagnetic metal layer, the interference between spin-polarized electrons while passing through the tunnel barrier layer is appropriately cut in parts in which lattices are not matched, and thus the spin-polarized electrons easily pass through the tunnel barrier layer. In addition, in a case where B is an aluminum ion, the lattice constant is likely to coincide with the lattice constant of an alloy including an element such as iron or cobalt that is a general ferromagnetic material, and thus an increase in the MR ratio at a high voltage can be realized.

In the magnetoresistance effect element, the volume ratio of the lattice-matched portion in the tunnel barrier layer with respect to the volume of the entire tunnel barrier layer may be 65% to 95%.

In a case where the volume ratio of the lattice-matched portion in the tunnel barrier layer is 65% or less, the effect of coherent tunneling decreases, and thus the MR ratio is reduced. In a case where the volume ratio of the lattice-matched portion in the tunnel barrier layer is 95% or greater, the interference effect between the spin-polarized electrons while passing through the tunnel barrier layer does not decrease, and thus an increase in passage of the spin-polarized electrons through the tunnel barrier layer is not observed. By making the number of constituent elements of the non-magnetic element smaller than half the number of elements of the aluminum ion, vacancies are generated in the cation sites, the vacancies and two or more types of non-magnetic elements occupy the cations sites, and thus lattice periodicity is disturbed. Accordingly, the MR ratio is further increased. In addition, this $V_{half}$ is 1 V or greater, and the magnetoresistance effect element can also be used in devices to which a high bias voltage is applied, such as high-sensitivity magnetic sensors, logic-in-memories, and MRAMs.

In the magnetoresistance effect element, the divalent cation of the non-magnetic element may be in a proportion of 15% to 42.5% with respect to the aluminum ion. In a case where the divalent cation of the non-magnetic element is in a proportion of 15% to 42.5% with respect to the aluminum ion, the cations are efficiently disordered, and thus a reduction in $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

In the magnetoresistance effect element, an element having the largest ionic radius among elements included in the divalent cation of the non-magnetic element may be included in a proportion of 12.5% to 90% in the divalent cation of the non-magnetic element. In a case where the element having the largest ionic radius is included in a proportion of 12.5% to 90% in the divalent cation of the non-magnetic element, the cations are efficiently disordered, and thus a phenomenon associated with $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, the tunnel barrier layer is expressed by a composition formula of $AB_2O_x$ ($0<x\leq4$), and has a spinel structure in which cations are arranged in a disordered manner, A is a divalent cation of plural non-magnetic elements, an element having the largest ionic radius among elements included in the divalent cation of the non-magnetic element is included in a proportion of 12.5% to 90% in the divalent cation in the tunnel barrier layer, and B is aluminum.

In the tunnel barrier layer having a spinel structure in which cations are disordered, in a case where a different non-magnetic element is disposed in a divalent cation site, the basic lattice constant becomes half the lattice constant of a conventional spinel structure, and the MR ratio is increased. In a case where the difference in ionic radius is small, the cations are unlikely to be ordered, and thus the lattice constant becomes smaller than that of a general spinel structure. Accordingly, the MR ratio is further increased in a case of two or more types of elements that are similar to each other in ionic radius. In a case where the divalent cation of the non-magnetic element is in a proportion of 15% to 42.5% with respect to the aluminum ion in the tunnel barrier layer, the cations are efficiently disordered, and thus a reduction in $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, the tunnel barrier layer is expressed by a composition formula of $AB_2O_x$ ($0<x\leq4$), and has a spinel structure in which cations are arranged in a disordered manner, the tunnel barrier layer has a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer, A is a divalent cation of plural non-magnetic elements, an element having the largest ionic radius among elements included in the divalent cation of the non-magnetic element is included in a proportion of 12.5% to 90% in the divalent cation, and B is aluminum.

In the tunnel barrier layer having a spinel structure in which cations are disordered, in a case where a different non-magnetic element is disposed in a divalent cation site, the basic lattice constant becomes half the lattice constant of a conventional spinel structure, and the MR ratio is increased. Furthermore, in the tunnel barrier layer, lattice-matched parts, which are lattice-matched with both of a first ferromagnetic metal layer and a second ferromagnetic metal layer, partially exist. In general, the tunnel barrier layer may be completely lattice-matched to both of the first ferromagnetic metal layer and the second ferromagnetic metal layer. However, in a case where the tunnel barrier layer is completely lattice-matched, spin-polarized electrons interfere with each other while passing through the tunnel barrier layer, and thus the electrons are do not easily pass through the tunnel barrier layer. In contrast, in a case where the tunnel barrier layer has a lattice-matched portion that is lattice-matched with both of the first ferromagnetic metal layer and the second ferromagnetic metal layer and a lattice-mismatched portion that is not lattice-matched with at least one of the first ferromagnetic metal layer and the second ferromagnetic metal layer, the interference between spin-polarized electrons while passing through the tunnel barrier layer is appropriately cut in parts in which lattices are not matched, and thus the spin-polarized electrons easily pass through the tunnel barrier layer. In addition, in a case where an element having the largest ionic radius among elements included in the divalent cation of the non-magnetic element is included in a proportion of 12.5% to 90% in the divalent cation in the tunnel barrier layer, the divalent cations of the non-magnetic elements are easily disordered, and the magnetoresistance ratio is increased. In addition, in a case where B is an aluminum ion, the lattice constant is likely to coincide with the lattice constant of an alloy including an element such as iron or cobalt that is a general ferromagnetic material, and thus an increase in the MR ratio at a high voltage can be realized.

In the magnetoresistance effect element, the volume ratio of the lattice-matched portion in the tunnel barrier layer with respect to the volume of the entire tunnel barrier layer may be 65% to 95%. In a case where the volume ratio of the lattice-matched part in the tunnel barrier layer is 65% or less, the effect of coherent tunneling is reduced, and thus the MR ratio is reduced. In a case where the volume ratio of the lattice-matched part in the tunnel barrier layer is 95% or greater, the interference effect between the spin-polarized electrons while passing through the tunnel barrier layer does not decrease, and thus an increase in passage of the spin-polarized electrons through the tunnel barrier layer is not observed. In a case where the difference in ionic radius is small, the cations are unlikely to be ordered, and thus the lattice constant becomes smaller than that of a general spinel structure. Accordingly, the MR ratio is further increased in a case of two or more types of elements that are similar to each other in ionic radius. In a case where the divalent cation of the non-magnetic element is in a proportion of 15% to 42.5% with respect to the aluminum ion in the tunnel barrier layer, the cations are efficiently disordered, and thus a reduction in $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

In the magnetoresistance effect element, the tunnel barrier layer may have a cubic structure as a basic structure. Since the tunnel barrier layer has a cubic structure, contribution out of a specific tunnel orbit is reduced, and the MR ratio is increased. The tunnel barrier layer exhibits characteristics even if its structure slightly deviates from the cubic structure. However, in a case where the tunnel barrier layer has a cubic structure, a higher MR ratio is shown.

In the magnetoresistance effect element, in the non-magnetic element, the divalent cation may be any one of Mg, Zn, Cd, Ag, Pt, and Pb. These non-magnetic elements are stable in a case where the number of valence is 2, and in a case where these non-magnetic elements are constituent elements of the tunnel barrier layer, coherent tunneling can be realized, and the MR ratio is increased.

In the magnetoresistance effect element, the first ferromagnetic metal layer may have larger coercivity than the second ferromagnetic metal layer. Since the coercivity of the first ferromagnetic metal layer is different from that of the second ferromagnetic metal layer, the element functions as a spin valve, which allows for device applications.

In the magnetoresistance effect element, at least one of the first ferromagnetic metal layer and the second ferromagnetic metal layer may have magnetic anisotropy perpendicular to a stacking direction. In a case where the element is used as a MRAM or a high-frequency device, no bias magnetic field is applied, and thus it is possible to reduce the device in size. In addition, the element can be allowed to function as a recording element since it has high thermal disturbance resistance.

In the magnetoresistance effect element, at least one of the first ferromagnetic metal layer and the second ferromagnetic metal layer may be $Co_2Mn_{1-a}Fe_aAl_bSi_{1-b}$ (0≤a≤1, 0≤b≤1). $Co_2Mn_{1-a}Fe_aAl_bSi_{1-b}$ is a ferromagnetic metal material having high spin polarizability, and a higher MR ratio can be obtained than in a case where another ferromagnetic metal material is used.

In the magnetoresistance effect element, the divalent cation of the non-magnetic element may be in a proportion of 7.5% to 37.5% with respect to the aluminum ion in the tunnel barrier layer. In a case where the divalent cation of the non-magnetic element is in a proportion of 7.5% to 37.5% with respect to the aluminum ion in the tunnel barrier layer, the cations are efficiently disordered, and thus a phenomenon associated with $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, the tunnel barrier layer is expressed by a composition formula of $AB_2O_x$ (0<x≤4), and has a spinel structure in which cations are arranged in a disordered manner, an A-site in the composition formula includes a cation of plural non-magnetic elements, and a B-site is aluminum. In a case where a different non-magnetic element is disposed in a cation site of the spinel structure of the tunnel barrier layer, the basic lattice constant becomes half the lattice constant of a conventional spinel structure, and the MR ratio is increased.

In the magnetoresistance effect element, a magnetoresistance ratio may be 100% or greater under application of a voltage of 1 V or greater at room temperature. The magnetoresistance effect element can also be used in devices to which a high bias voltage is applied, such as high-sensitivity magnetic sensors, logic-in-memories, and MRAMs.

In order to solve the above-described problems, a magnetoresistance effect element according to the invention has a first ferromagnetic metal layer, a second ferromagnetic metal layer, and a tunnel barrier layer that is sandwiched between the first and second ferromagnetic metal layers, the tunnel barrier layer is expressed by a composition formula of $AB_2O_x$ (0<x≤4), the tunnel barrier layer has a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer, the tunnel barrier layer has a spinel structure in which cations are arranged in a disordered manner, an A-site in the composition formula includes a cation of plural non-magnetic elements, and a B-site is an aluminum ion. In a case where a different non-magnetic element is disposed in a cation site of the spinel structure of the tunnel barrier layer, the basic lattice constant becomes half the lattice constant of a conventional spinel structure, and the MR ratio is increased. In addition, in a case where B is an aluminum ion, the lattice constant is likely to coincide with the lattice constant of an alloy including an element such as iron or cobalt that is a ferromagnetic material with a general lattice constant, and thus an increase in the MR ratio at a high voltage can be realized.

In the tunnel barrier layer having a spinel structure in which cations are disordered, in a case where a different non-magnetic element is disposed in a divalent cation site, the basic lattice constant becomes half the lattice constant of a conventional spinel structure, and the MR ratio is increased. Furthermore, the tunnel barrier layer has a lattice-matched part that is lattice-matched with both of the first ferromagnetic metal layer and the second ferromagnetic metal layer. In general, the tunnel barrier layer may be completely lattice-matched to both of the first ferromagnetic metal layer and the second ferromagnetic metal layer. However, in a case where the tunnel barrier layer is completely lattice-matched, spin-polarized electrons interfere with each other while passing through the tunnel barrier layer, and thus the electrons do not easily pass through the tunnel barrier layer. In contrast, in a case where a lattice-matched part in which lattices are matched partially exists, interference of spin-polarized electrons while passing through the tunnel barrier layer is appropriately cut in a part in which lattices are not matched, and thus the spin-polarized electrons easily pass through the tunnel barrier layer.

In the magnetoresistance effect element, a volume ratio of the lattice-matched portion in the tunnel barrier layer with respect to a volume of the entire tunnel barrier layer may be 65% to 95%. In a case where the volume ratio of the lattice-matched part in the tunnel barrier layer is 65% or less, the effect of coherent tunneling is reduced, and thus the MR ratio is reduced. In a case where the volume ratio of the lattice-matched part in the tunnel barrier layer is 95% or greater, the interference effect between the spin-polarized electrons while passing through the tunnel barrier layer cannot be weakened, and thus an increase in passage of the spin-polarized electrons through the tunnel barrier layer is not observed. In addition, this $V_{half}$ is 1 V or greater, and the magnetoresistance effect element can also be used in devices to which a high bias voltage is applied, such as high-sensitivity magnetic sensors, logic-in-memories, and MRAMs.

In the magnetoresistance effect element, a size of a film surface of the lattice-matched portion of the tunnel barrier layer in a direction parallel thereto may be 30 nm or less.

In the magnetoresistance effect element, the tunnel barrier layer may have a film thickness of 1.7 nm to 3.0 nm.

Effects of the Invention

According to the invention, it is possible to provide a magnetoresistance effect element that obtains a higher MR ratio than TMR elements using a conventional spinel tunnel barrier at a high bias voltage.

BRIEF DESCRIPTION OF DRAWINGS

FIG. 24(A) shows a high-resolution cross-section TEM. FIG. 24(B) shows an image obtained by performing inverse Fourier analysis.

FIG. 26(A) is a diagram showing element resistance (Rp) when magnetization directions of the first ferromagnetic metal layer and the second ferromagnetic metal layer are parallel to each other. FIG. 26(B) is a diagram showing element resistance (Rap) when magnetization directions of the first ferromagnetic metal layer and the second ferromagnetic metal layer are antiparallel to each other. FIG. 26(C) is a diagram showing a magnetoresistance ratio of the element. FIG. 26(D) is a diagram showing $V_{half}$ of the element.

EMBODIMENTS FOR CARRYING OUT THE INVENTION

Figure 1:
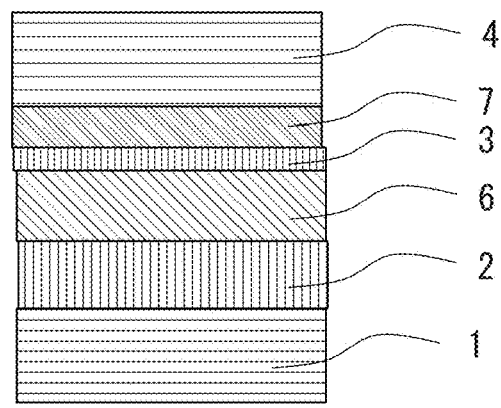
FIG. 1 shows a stacked structure of a magnetoresistance effect element.
Figure 1:
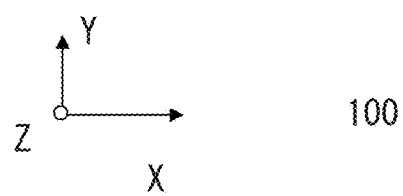

Hereinafter, embodiments of the invention will be described in detail with reference to the accompanying drawings. In the description of the drawings, the same elements will be denoted by the same reference numerals, and an overlapping description thereof will be omitted.

(First Embodiment)

Hereinafter, a magnetoresistance effect element 100 according to a first embodiment will be described. The magnetoresistance effect element 100 has a first ferromagnetic metal layer 6, a second ferromagnetic metal layer 7, and a tunnel barrier layer 3 sandwiched between the first and second ferromagnetic metal layers. The tunnel barrier layer is expressed by a composition formula of $AB_2O_x$ (0<x≤4), and has a spinel structure in which cations are arranged in a disordered manner. A is a divalent cation of plural nonmagnetic elements, and B is aluminum. In the composition formula, the number of elements of the divalent cation is smaller than half the number of elements of the aluminum ion.

(Basic Structure)

In the example shown in FIG. 1, a magnetoresistance effect element 100 is provided on a substrate 1, and has a stacked structure provided with an underlayer 2, a first ferromagnetic metal layer 6, a tunnel barrier layer 3, a second ferromagnetic metal layer 7, and a cap layer 4 in order from the substrate 1.

(Tunnel Barrier Layer)

The tunnel barrier layer 3 is made of a non-magnetic insulating material. In general, the tunnel barrier layer has a film thickness of 3 nm or less, and in a case where the tunnel barrier layer is sandwiched between metal materials, a wave function of electrons of atoms of the metal materials extends beyond the tunnel barrier layer 3, and thus a current may flow regardless of the presence of an insulating material on the circuit. The magnetoresistance effect element 100 is classified into two types including: a type in which the typical tunneling effect is used; and a type in which the coherent tunneling effect where an orbit for tunneling is limited is predominant. In the typical tunneling effect, a magnetoresistance effect is obtained by spin polarization of ferromagnetic materials. On the other hand, in the coherent tunneling, an orbit for tunneling is limited. Therefore, in a magnetoresistance effect element in which coherent tunneling is predominant, an effect higher than or equivalent to spin polarization of ferromagnetic metal materials can be expected. In order to exhibit the coherent tunneling effect, it is necessary that the ferromagnetic metal materials and the tunnel barrier layer 3 be crystallized and joined in a specific orientation.

(Spinel Structure)

Figure 2:
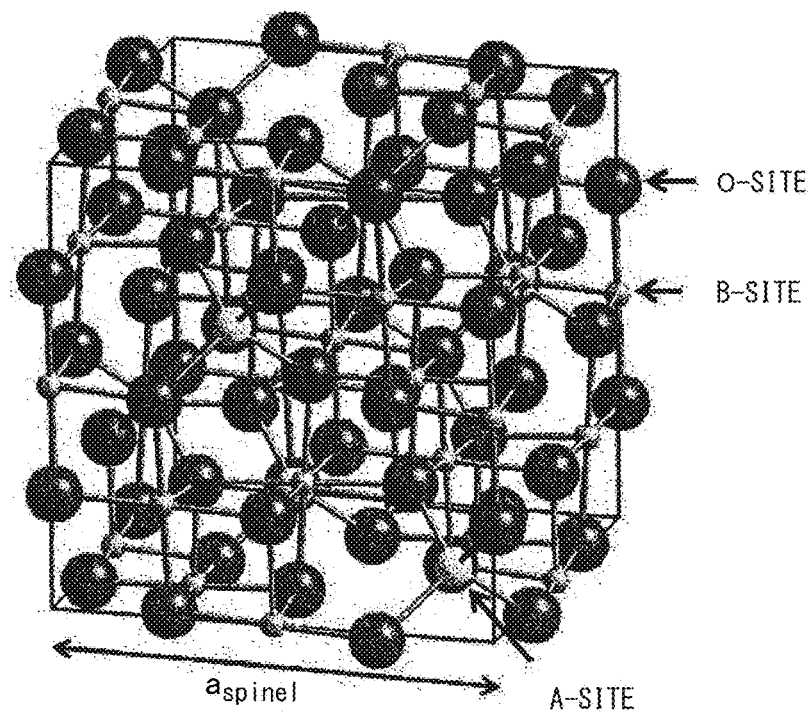
FIG. 2 is a diagram of a crystal structure of a spinel.
Figure 3:
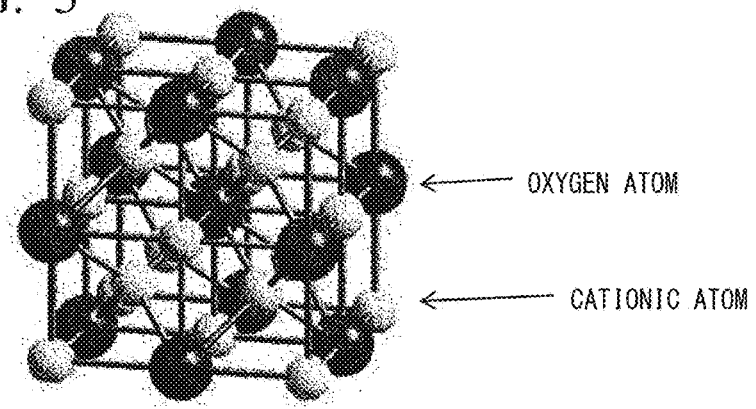
FIG. 3 is a schematic diagram of an ordered spinel structure and a disordered spinel structure with symmetry of Fm-3m having a lattice constant assumed in a tunnel barrier layer of the invention.
Figure 4:
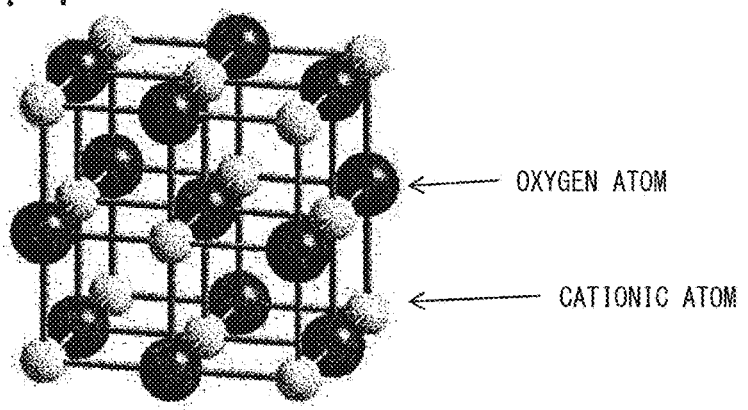
FIG. 4 is a schematic diagram of an ordered spinel structure and a disordered spinel structure with symmetry of Fm-3m having a lattice constant assumed in a tunnel barrier layer of the invention.
Figure 5:
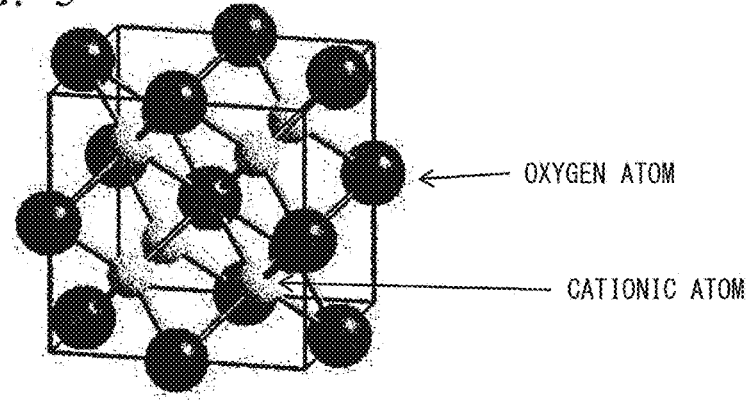
FIG. 5 is a schematic diagram of an ordered spinel structure and a disordered spinel structure with symmetry of Fm-3m having a lattice constant assumed in a tunnel barrier layer of the invention.
Figure 6:
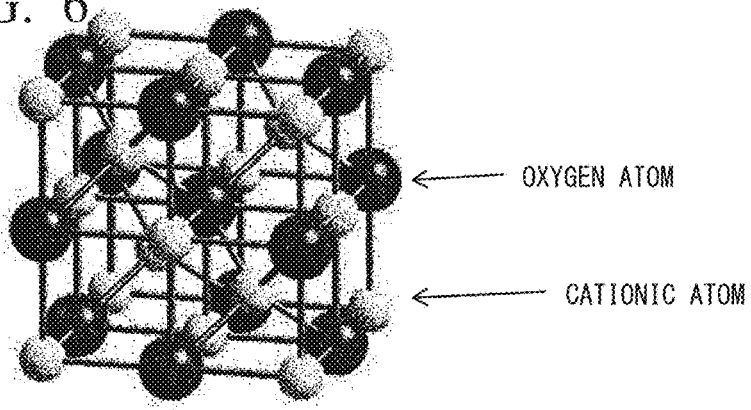
FIG. 6 is a schematic diagram of an ordered spinel structure and a disordered spinel structure with symmetry of F-43m having a lattice constant assumed in a tunnel barrier layer of the invention.
Figure 7:
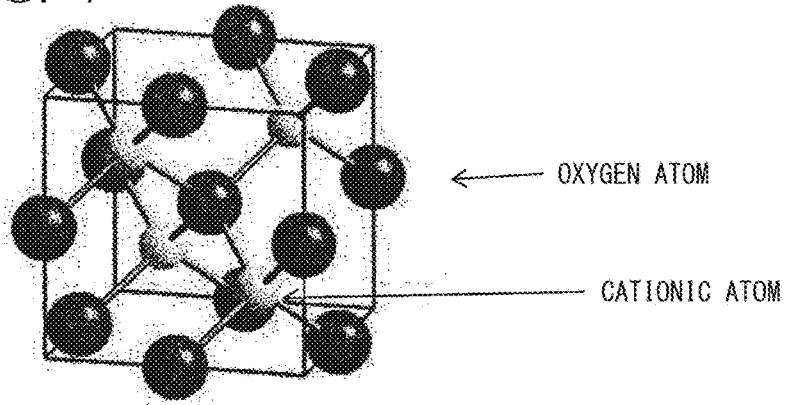
FIG. 7 is a schematic diagram of an ordered spinel structure and a disordered spinel structure with symmetry of F-43m having a lattice constant assumed in a tunnel barrier layer of the invention.

FIG. 2 shows a spinel structure. An A-site in which oxygen is fourfold coordinated to cations and a B-site in which oxygen is sixfold coordinated to cations exist. Here, a Sukenel structure referring to the spinel structure in which cations are disordered is a structure that has a lattice constant half the lattice constant of an ordered spinel structure while a position of an oxygen atom of the ordered spinel is almost not changed, and in which cations are positioned in tetrahedral positions and octahedral positions of oxygen atoms that are not occupied under ordinary circumstances. At this time, this structure may include a total of five structures shown in FIGS. 3 to 7, and may be any one of them or a mixed structure thereof.

(Definition of Disordered Spinel Structure)

In this specification, the spinel structure in which cations are disordered may be referred to as a Sukenel structure. The Sukenel structure refers to a structure where oxygen atoms are arranged in cubic close-packed lattice that is substantially similar to spinel lattice, the structure as a whole belongs to a cubic structure, but arrangement of cations are disordered. In an original ordered spinel, Mg and Al are arranged in order in the tetrahedral vacancies and octahedral vacancies in the original spinel. However, since these are arranged in random arrangement in the Sukenel structure, the crystal symmetry of the structure is different from $MgAl_2O_4$, and the lattice constant of the structure is substantially half of that of $MgAl_2O_4$. With a change in the lattice-repeating unit, a combination between the ferromagnetic layer material and the electronic structure (band structure) is changed, and thus a large TMR enhancement due to a coherent tunneling effect is obtained. For example, a space group of $MgAl_2O_4$ that is a non-magnetic spinel material is Fd-3m, but a space group of a disordered spinel structure with a lattice constant reduced by half is known to be changed to Fm-3m or F-43m, and there are total five structures (Non-Patent Document 2). Any one of them can be used.

In this specification, the Sukenel structure is not essentially required to be a cubic structure. In the stacked structure, the crystal structure is influenced by the crystal structure of the material of an underlayer, and the lattice is thus partially distorted. Each material has a bulk crystal structure, but in a case where it is formed into a thin film, a partially distorted crystal structure based on the bulk crystal structure can be taken. Particularly, in the invention, the tunnel barrier layer has a very thin structure, and is easily influenced by the crystal structure of the layer brought into contact with the tunnel barrier layer. In this regard, the bulk crystal structure of a Sukenel structure is a cubic structure, and in this specification, the Sukenel structure includes a Sukenel structure which does not have a cubic structure in addition to a Sukenel structure slightly deviating from the cubic structure. A deviation from the cubic structure in the Sukenel structure described in this specification is generally slight, and this deviation depends on the accuracy of a measurement method for evaluating the structure.

The B-site is an aluminum ion.

The A-site is a divalent cation of plural non-magnetic elements. Here, the number of elements of the divalent cation is smaller than half the number of elements of the aluminum ion. By making the number of constituent elements of the non-magnetic element smaller than half the number of elements of the aluminum ion, holes are generated in the cations, the holes and two or more types of non-magnetic elements occupy the cations, and thus lattice periodicity is disturbed. Accordingly, the MR ratio is further increased. In addition, this $V_{half}$ is 1 V or greater, and the magnetoresistance effect element can also be used in devices to which a high bias voltage is applied, such as high-sensitivity magnetic sensors, logic-in-memories, and MRAMs.

The divalent cation of the non-magnetic element is preferably any one of Mg, Zn, Cd, Ag, Pt, or Pb. These non-magnetic elements are stable in a case where the number of valence is 2, and in a case where these plural non-magnetic elements are constituent elements of the tunnel barrier layer, disorder is promoted, and thus coherent tunneling is increased, and the MR ratio is increased.

The difference in ionic radius between the divalent cations of the plural non-magnetic elements is preferably 0.2 A or less. In a case where the difference in ionic radius is small, the cations are unlikely to be ordered, and thus the lattice constant becomes smaller than that of a general spinel structure. Accordingly, disorder is promoted in a case of two or more types of elements that are similar to each other in ionic radius, and the MR ratio is further increased.

The divalent cation of the non-magnetic element is preferably in a proportion of 15% to 42.5% with respect to the aluminum ion. In a case where the divalent cation of the non-magnetic element is in a proportion of 15% to 42.5% with respect to the aluminum ion, the cations are efficiently disordered, and thus a reduction in $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

An element having the largest ionic radius among the elements included in the divalent cation of the non-magnetic element is preferably included in a proportion of 12.5% to 90% in the divalent cation of the non-magnetic element. In a case where the element having the largest ionic radius is included in a proportion of 12.5% to 90% in the divalent cation of the non-magnetic element, the cations are efficiently disordered, and thus a phenomenon associated with $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

The tunnel barrier layer preferably has a lattice-matched part that is lattice-matched with both of a first ferromagnetic metal layer and a second ferromagnetic metal layer. In general, the tunnel barrier layer may be completely lattice-matched to both of the first ferromagnetic metal layer and the second ferromagnetic metal layer. However, in a case where the tunnel barrier layer is completely lattice-matched, spin-polarized electrons interfere with each other while passing through the tunnel barrier layer, and thus the electrons does not easily pss through the tunnel barrier layer. In contrast, in a case where a lattice-matched part in which lattices are matched partially exists, interference of spin-polarized electrons while passing through the tunnel barrier layer is appropriately cut in a part in which lattices are not matched, and thus the spin-polarized electrons easily pass through the tunnel barrier layer. A volume ratio of the lattice-matched part in the tunnel barrier layer with respect to the volume of the entire tunnel barrier layer is preferably 65% to 95%. In a case where the volume ratio of the lattice-matched part in the tunnel barrier layer is 65% or less, the effect of coherent tunneling is reduced, and thus the MR ratio is reduced. In a case where the volume ratio of the lattice-matched part in the tunnel barrier layer is 95% or greater, the interference effect between the spin-polarized electrons while passing through the tunnel barrier layer cannot be weakened, and thus an increase in passage of the spin-polarized electrons through the tunnel barrier layer is not observed.

(First Ferromagnetic Metal Layer)

Examples of the material of the first ferromagnetic metal layer 6 include metal selected from the group consisting of Cr, Mn, Co, Fe, and Ni, and ferromagnetic alloy including one or more of the metals of the group. The examples also include alloy including one or more metals selected from the group and at least one element of B, C, and N. Specific examples thereof include Co—Fe and Co—Fe—B. A Heusler alloy such as $Co_2FeSi$ is preferable in order to obtain a high output. The Heusler alloy includes intermetallic compounds having a chemical composition of $X_2YZ$. X denotes a Co, Fe, Ni, or Cu group transition metal element or noble metal in the periodic table, Y denotes a Mn, V, Cr, or Ti group transition metal, and can also take the elemental species of X, and Z denotes representative elements of III to V groups. Examples thereof include $Co_2FeSi$, $Co_2MnSi$, and $Co_2Mn_{1-a}Fe_aAl_bSi_{1-b}$. In addition, an antiferromagnetic material such as IrMn and PtMn may be used as a material brought into contact with the first ferromagnetic metal layer 6 in order to make coercivity of the first ferromagnetic metal layer larger than that of the second ferromagnetic metal layer 7. Furthermore, the first ferromagnetic metal layer may have a synthetic ferromagnetic coupling structure such that the second ferromagnetic metal layer 7 is not influenced by a leakage magnetic field of the first ferromagnetic metal layer 6.

In a case where a magnetization direction of the first ferromagnetic metal layer 6 is made perpendicular to the stacked plane, a stacked film of Co and Pt is preferably used. For example, in a case where the first ferromagnetic metal layer 6 has a composition of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the magnetization direction can be made perpendicular to the stacked plane.

(Second Ferromagnetic Metal Layer)

A ferromagnetic material, particularly, a soft magnetic material is applied as a material of the second ferromagnetic metal layer 7, and examples thereof include metal selected from the group consisting of Cr, Mn, Co, Fe, and Ni, alloy including one or more of the metals of the group, and alloy including one or more metals selected from the group and at least one element of B, C, and N. Specific examples thereof include Co—Fe, Co—Fe—B, and Ni—Fe.

In a case where a magnetization direction of the second ferromagnetic metal layer 7 is made perpendicular to the stacked plane, the ferromagnetic material preferably has a thickness of 2.5 nm or less. Perpendicular magnetic anisotropy can be applied to the second ferromagnetic metal layer 7 at an interface between the second ferromagnetic metal layer 7 and the tunnel barrier layer 3. The second ferromagnetic metal layer 7 preferably has a small film thickness since the effect of the perpendicular magnetic anisotropy is reduced if the second ferromagnetic metal layer 7 has a large film thickness.

In general, the first ferromagnetic metal layer 6 has a structure in which the magnetization direction thereof is fixed, and is called a fixed layer. In addition, since the second ferromagnetic metal layer 7 has a magnetization direction that can be more easily changed by an external magnetic field or a spin torque than the first ferromagnetic metal layer 6, the second ferromagnetic metal layer is called a free layer.

(Substrate)

A magnetoresistance effect element according to the invention may be formed on a substrate.

In that case, a material showing excellent flatness is preferably used as a material of the substrate 1. The substrate 1 differs depending on the purpose. For example, in a case of MRAM, a circuit formed in a Si substrate can be used under the magnetoresistance effect element. In a case of a magnetic head, an AlTiC substrate that can be easily processed can be used.

(Underlayer)

In a case where a magnetoresistance effect element according to the invention is formed on a substrate, first, an underlayer may be formed on the substrate.

In that case, the underlayer 2 is used to control crystallinity such as crystal orientation and crystal grain size of the first ferromagnetic metal layer 6 and layers formed above the first ferromagnetic metal layer 6. Therefore, it is important to select the material of the underlayer 2. Hereinafter, the material and the configuration of the underlayer 2 will be described. Any of a conductive material and an insulating material may be used for the underlayer, but in a case where electric power is fed to the underlayer, a conductive material is preferably used. First, as a first example of the underlayer 2, a nitride layer having a (001)-oriented NaCl structure and containing at least one element selected from the group consisting of Ti, Zr, Nb, V, Hf, Ta, Mo, W, B, Al, and Ce is exemplified. As a second example of the underlayer 2, a (002)-oriented perovskite conductive oxide layer made of $RTO_3$ is exemplified. Here, the R-site includes at least one element selected from the group consisting of Sr, Ce, Dy, La, K, Ca, Na, Pb, and Ba, and the T-site includes at least one element selected from the group consisting of Ti, V, Cr, Mn, Fe, Co, Ni, Ga, Nb, Mo, Ru, Ir, Ta, Ce, and Pb. As a third example of the underlayer 2, an oxide layer having a (001)-oriented NaCl structure and containing at least one element selected from the group consisting of Mg, Al, and Ce is exemplified. As a fourth example of the underlayer 2, a layer having a (001)-oriented tetragonal or cubic structure and containing at least one element selected from the group consisting of Al, Cr, Fe, Co, Rh, Pd, Ag, Ir, Pt, Au, Mo, and W is exemplified. As a fifth example of the underlayer 2, a layer having a stacked structure with a combination of two or more of the layers of the above first to fourth examples is exemplified. By devising the structure of the underlayer as described above, it is possible to control the crystallinity of the ferromagnetic layer 2 and layers formed above the ferromagnetic layer 2, thereby improving the magnetic characteristics.

(Cap Layer)

A cap layer may be formed on the second ferromagnetic metal layer of the magnetoresistance effect element according to the invention.

A cap layer 4 is installed above the second ferromagnetic metal layer 7 in a stacking direction in order to control crystallinity such as crystal orientation and crystal grain size and element diffusion. In a case where a free layer having a bcc structure is formed, the crystal structure of the cap layer may be any one of a fcc structure, a hcp structure, and a bcc structure. In a case where a free layer having a fcc structure is formed, the crystal structure of the cap layer may be any one of a fcc structure, a hcp structure, and a bcc structure. The film thickness of the cap layer may be within such a range that a distortion relaxation effect is obtained and a reduction in the MR ratio by shunt is not shown. The film thickness of the cap layer is preferably 1 nm to 30 nm.

(Shape and Dimensions of Element)

A laminate formed of the first ferromagnetic metal layer, the tunnel barrier layer, and the second ferromagnetic metal layer 2 constituting the invention has a columnar shape. In addition, it may have various shapes such as a circular shape, a square shape, a triangle shape, and a polygonal shape when viewed from top, and preferably has a circular shape from the viewpoint of symmetry. That is, the laminate preferably has a columnar shape.

Figure 8:
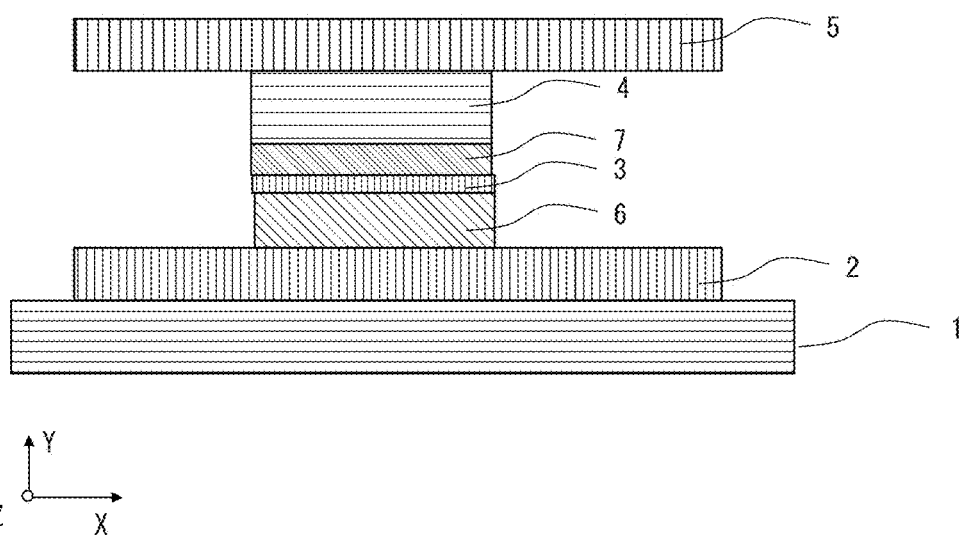
FIG. 8 is a diagram showing an evaluation structure of a magnetoresistance effect element according to an embodiment in a direction perpendicular to a stacking direction.
Figure 9:
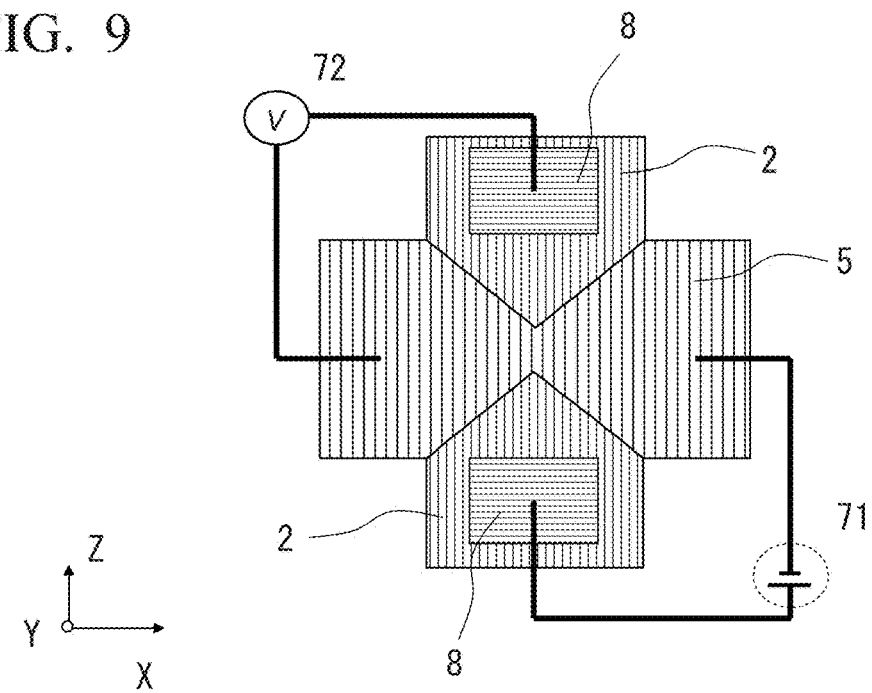
FIG. 9 is a diagram showing an evaluation structure of a magnetoresistance effect element 100 in a stacking direction.

FIGS. 8 and 9 show examples of the shape and the dimensions of the magnetoresistance effect element.

FIG. 8 is a diagram showing a structure when viewed from a side in a stacking direction of the magnetoresistance effect element 100. The magnetoresistance effect element 100 of FIG. 8 has an electrode layer 5 formed above the cap layer 4 shown in FIG. 1. FIG. 9 is a diagram showing a structure when viewed in the stacking direction of the magnetoresistance effect element 100. In FIG. 9, a current source 71 and a voltmeter 72 are also shown.

The magnetoresistance effect element 100 is processed into a columnar shape of 80 nm or less as shown in FIGS. 8 and 9, and wiring is applied. Since the magnetoresistance effect element 100 is processed into a columnar shape having a size of 80 nm or less, a domain structure is not likely to be formed in the ferromagnetic metal layers, and it is not necessary to consider a component having a different spin polarization in the ferromagnetic metal layers In FIG. 9, the magnetoresistance effect element 100 is disposed at a position where the underlayer 2 and the electrode layer 5 intersect each other.

(Evaluation Method)

The magnetoresistance effect element 100 can be evaluated with the structure shown in FIGS. 8 and 9. For example, the power supply 71 and the voltmeter 72 are disposed as shown in FIG. 9 such that a fixed current or a fixed voltage is applied to the magnetoresistance effect element 100. By measuring the voltage or the current while sweeping an external magnetic field, a change in the resistance of the magnetoresistance effect element 100 can be measured.

In general, the MR ratio is expressed by the following formula.

MR Ratio (%)={$(R_{AP}-R_P)/R_P$}×100

$R_P$ denotes a resistance in a case where magnetization directions of the first ferromagnetic metal layer 6 and the second ferromagnetic metal 7 are parallel to each other, and $R_{AP}$ denotes a resistance in a case where magnetization directions of the first ferromagnetic metal layer 6 and the second ferromagnetic metal 7 are antiparallel to each other.

In a case where a strong current flows in the magnetoresistance effect element 100, magnetization rotation occurs by a STT effect, and a resistance value of the magnetoresistance effect element 100 is rapidly changed. The current value at which the resistance value is rapidly changed is called an inversion current value (Jc).

(Others)

In this example, the structure has been exemplified in which the first ferromagnetic metal layer 6 having high coercivity is disposed on the lower side, but the invention is not limited to this structure. In a case of a structure in which the first ferromagnetic metal layer 6 having high coercivity is disposed on the upper side, the coercivity is reduced in comparison with a case in which the first ferromagnetic metal layer 6 is disposed on the lower side, but the tunnel barrier layer 3 can be formed by utilizing the crystallinity of the substrate, and thus the MR ratio can be increased.

In order to utilize the magnetoresistance effect element as a magnetic sensor, a resistance change preferably changes linearly with respect to an external magnetic field. In a general stacked film of ferromagnetic layers, magnetization directions are easily directed into the lamination plane by shape anisotropy. In this case, for example, a magnetic field is applied from outside to make the magnetization directions of the first ferromagnetic metal layer and the second ferromagnetic metal layer intersect each other, thereby changing the resistance change linearly with respect to the external magnetic field. However, in this case, since a mechanism that applies a magnetic field is required near the magnetoresistance effect element, this is not preferable for integration. In a case where the ferromagnetic metal layer itself has perpendicular magnetic anisotropy, this is advantageous for integration since a method such as application of a magnetic field from outside is not required.

The magnetoresistance effect element using this embodiment can be used as a magnetic sensor or a memory such as a MRAM. Particularly, this embodiment is effective for products that are used with a bias voltage higher than a bias voltage used in conventional magnetic sensors.

(Manufacturing Method)

The magnetoresistance effect element 100 can be formed using, for example, a magnetron sputtering apparatus.

The tunnel barrier layer 3 can be produced through a known method. For example, a thin metal film is formed on the first ferromagnetic metal layer 6 by sputtering, performing plasma oxidation or natural oxidation by oxygen introduction thereon, and performing a heat treatment thereon. As the film-forming method, not only a magnetron sputtering method but also a thin film-forming method such as a vapor deposition method, a laser ablation method, or a MBE method can be used.

Each of the underlayer, the first ferromagnetic metal layer, the second ferromagnetic metal layer, and the cap layer can be formed through a known method.

(Second Embodiment)

A magnetoresistance effect element according to a second embodiment has a first ferromagnetic metal layer, a second ferromagnetic metal layer, and a tunnel barrier layer sandwiched between the first and second ferromagnetic metal layers, and the tunnel barrier layer is expressed by a composition formula of $AB_2O_x$ (0<x≤4), and has a spinel structure in which cations are arranged in a disordered manner. A is a divalent cation of plural non-magnetic elements, and an element having the largest ionic radius among the elements included in the divalent cation of the non-magnetic element is included in a proportion of 12.5% to 90% in the divalent cation of the non-magnetic element in the tunnel barrier layer 3. B is an aluminum ion.

In a case where the element having the largest ionic radius is included in a proportion of 12.5% to 90% in the divalent cation of the non-magnetic element, the cations are efficiently disordered, and thus a phenomenon associated with $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

(Third Embodiment)

A magnetoresistance effect element according to a third embodiment has a first ferromagnetic metal layer, a second ferromagnetic metal layer, and a tunnel barrier layer sandwiched between the first and second ferromagnetic metal layers, and the tunnel barrier layer is expressed by a composition formula of $AB_2O_x$ (0<x≤4), and has a spinel structure in which cations are arranged in a disordered manner. An A-site in the composition formula includes a cation of plural non-magnetic elements, and a B-site is aluminum.

(Fourth Embodiment)

A magnetoresistance effect element according to a fourth embodiment has a first ferromagnetic metal layer, a second ferromagnetic metal layer, and a tunnel barrier layer sandwiched between the first and second ferromagnetic metal layers, and the tunnel barrier layer is expressed by a composition formula of $AB_2O_x$ (0<x≤4). The tunnel barrier layer has a lattice-matched part (lattice-matched portion) that is lattice-matched with both of the first ferromagnetic metal layer and the second ferromagnetic metal layer, and has a spinel structure in which cations are arranged in a disordered manner. A is a divalent cation of plural non-magnetic elements, and B is aluminum. In the composition formula, the number of elements of the divalent cation is smaller than half the number of elements of the aluminum ion.

A volume ratio of the lattice-matched part (lattice-matched portion) in the tunnel barrier layer with respect to the volume of the entire tunnel barrier layer may be 65% to 95%.

(Fifth Embodiment)

A magnetoresistance effect element according to a fifth embodiment has a first ferromagnetic metal layer, a second ferromagnetic metal layer, and a tunnel barrier layer sandwiched between the first and second ferromagnetic metal layers, and the tunnel barrier layer 3 is expressed by a composition formula of $AB_2O_x$ (0<x≤4), and has a spinel structure in which cations are arranged in a disordered manner. The tunnel barrier layer is expressed by a composition formula of $AB_2O_x$ (0<x≤4). The tunnel barrier layer has a lattice-matched part (lattice-matched portion) that is lattice-matched with both of the first ferromagnetic metal layer and the second ferromagnetic metal layer. A is a divalent cation of plural non-magnetic elements, and an element having the largest ionic radius among the elements included in the divalent cation of the non-magnetic element is included in a proportion of 12.5% to 90% in the divalent cation in the tunnel barrier layer 3. B is an aluminum ion.

A volume ratio of the lattice-matched part (lattice-matched portion) in the tunnel barrier layer with respect to the volume of the entire tunnel barrier layer may be 65% to 95%.

In a case where the element having the largest ionic radius is included in a proportion of 12.5% to 90% in the divalent cation of the non-magnetic element, the cations are efficiently disordered, and thus a phenomenon associated with \$T_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs.

(Sixth Embodiment)

A magnetoresistance effect element according to a sixth embodiment has a first ferromagnetic metal layer, a second ferromagnetic metal layer, and a tunnel barrier layer sandwiched between the first and second ferromagnetic metal layers, and the tunnel barrier layer is expressed by a composition formula of $AB_2O_x$ (0<x≤4), and has a spinel structure in which cations are arranged in a disordered manner. The tunnel barrier layer is expressed by a composition formula of $AB_2O_x$ (0<x≤4). The tunnel barrier layer has a lattice-matched part (lattice-matched portion) that is lattice-matched with both of the first ferromagnetic metal layer and the second ferromagnetic metal layer, and has a spinel structure in which cations are arranged in a disordered manner. An A-site in the composition formula includes a cation of plural non-magnetic elements, and a B-site is aluminum.

A volume ratio of the lattice-matched part (lattice-matched portion) in the tunnel barrier layer with respect to the volume of the entire tunnel barrier layer may be 65% to 95%.

(Manufacturing Method)

The fourth embodiment is different from the first embodiment only in the method of forming a tunnel barrier layer. The fifth embodiment is different from the second embodiment only in the method of forming a tunnel barrier layer. The sixth embodiment is different from the second embodiment only in the method of forming a tunnel barrier layer. Since the difference in the method of forming a tunnel barrier layer is common to the fourth to sixth embodiments, only the fourth embodiment will be described.

In the first embodiment, the tunnel barrier layer is formed by repeatedly performing formation and oxidation of a metal film. In the fourth embodiment, the substrate temperature is lowered to −70 to −30 degrees, and then oxidation is performed in the oxidation step. By cooling the substrate, a temperature gradient is generated between the substrate and the vacuum or between the substrate and the plasma. First, in a case where a surface of the substrate is exposed to oxygen, the oxygen reacts with the metal material and the metal material is oxidized. However, the oxidation does not proceed due to the low temperature. Accordingly, the oxygen amount of the tunnel barrier layer is easily adjusted. Moreover, by forming the temperature gradient, epitaxial growth (lattice-matched growth) is easily adjusted. Since the crystal growth proceeds by the temperature gradient, the epitaxial growth is easily performed in a case where the temperature of the substrate is sufficiently lowered. In a case where the temperature of the substrate is increased, domains are formed and plural crystal nuclei are thus formed in the plane. The crystal nuclei are independently epitaxially grown, and thus a part in which lattices are not matched is formed in a part in which the domains subjected to the crystal growth are in contact with each other.

(Method of Calculating Volume Ratio of Lattice-Matched Portion)

The volume ratio of the lattice-matched part (lattice-matched portion) with respect to the volume of the entire tunnel barrier layer can be estimated from, for example, a TEM image. Regarding whether the lattices are matched, a part including the tunnel barrier layer, the first ferromagnetic metal layer, and the second ferromagnetic metal layer in a cross-section TEM image is Fourier-transformed to obtain an electron beam diffraction image. In the electron beam diffraction image obtained by Fourier transformation, electron beam diffraction spots in a direction other than the stacking direction are removed. That image is subjected to inverse Fourier transformation to provide an image in which information only in the stacking direction is obtained. In lattice lines in the inverse Fourier image, a part in which the tunnel barrier layer is continuously connected to both of the first ferromagnetic metal layer and the second ferromagnetic metal layer is defined as a lattice-matched portion. In addition, in lattice lines, a part in which the tunnel barrier layer is not continuously connected to at least one of the first ferromagnetic metal layer and the second ferromagnetic metal layer, or in which no lattice lines are detected is defined as a lattice-mismatched portion. In the lattice-matched portion, in the lattice lines in the inverse Fourier image, the layers are continuously connected from the first ferromagnetic metal layer to the second ferromagnetic metal layer via the tunnel barrier layer, and thus a width ($L_C$) of the lattice-matched portion can be measured from the TEM image. Similarly, in the lattice-mismatched portion, in the lattice lines in the inverse Fourier image, the layers are not continuously connected, and thus a width ($L_I$) of the lattice-mismatched portion can be measured from the TEM image. Using the width ($L_C$) of the lattice-matched portion as a numerator and using the sum of the width ($L_C$) of the lattice-matched portion and the width ($L_I$) of the lattice-mismatched portion as a denominator, the volume ratio of the lattice-matched portion with respect to the volume of the entire tunnel barrier layer can be obtained. The TEM image is a cross-section image, but includes information including a depth. Accordingly, it can be thought that the region estimated from the TEM image is proportional to the volume.

Figure 24:
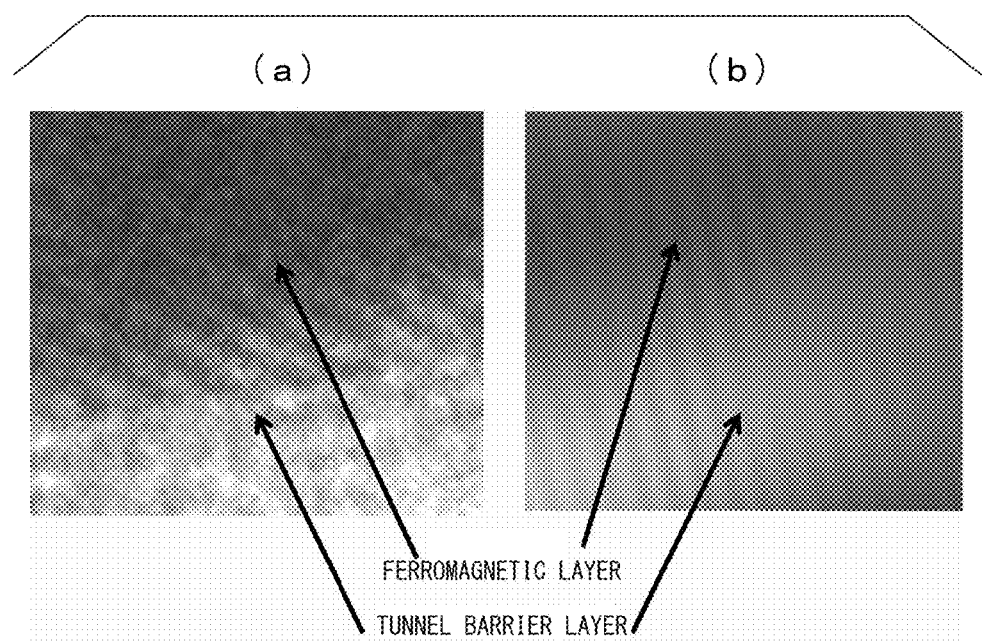
FIG. 24 shows an example of a part in which the tunnel barrier layer and the ferromagnetic metal layer are lattice-matched.
Figure 25:
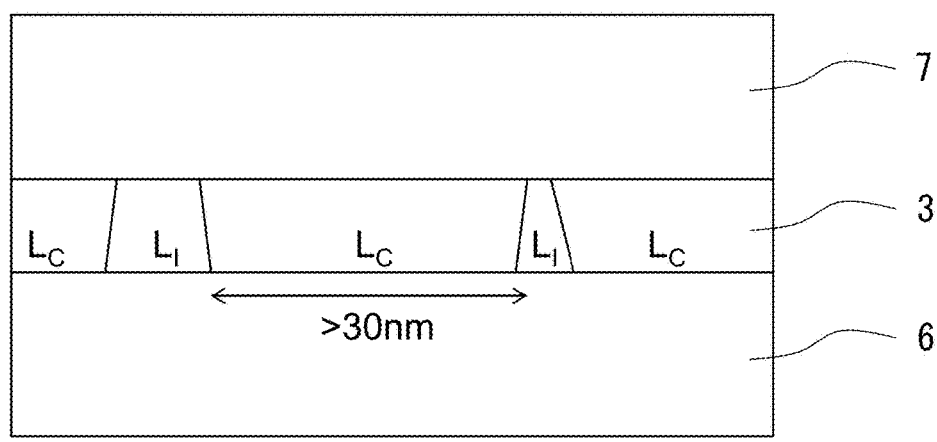
FIG. 25 is a diagram showing a structure of a cross-section including a direction parallel to a stacking direction of Example 11.

FIG. 24 shows an example of the part in which the tunnel barrier layer and the ferromagnetic metal layer are lattice-matched. FIG. 24(A) shows an example of a high-resolution cross-section TEM image. FIG. 24(B) shows an example of an image obtained by performing inverse Fourier transformation after removal of electron beam diffraction spots in directions other than the stacking direction in the electron beam diffraction image. In FIG. 24(B), components perpendicular to the stacking direction are removed, and thus lattice lines can be observed in the stacking direction. This shows that the tunnel barrier layer and the ferromagnetic metal layer are continuously connected to each other without interruption at an interface therebetween.

EXAMPLES

Example 1

Hereinafter, an example of the method of manufacturing a magnetoresistance effect element according to the first embodiment will be described. Film formation was performed on a substrate provided with a thermal silicon oxide film using a magnetron sputtering method. As an underlayer, a film of 5 nm thick Ta/3 nm thick Ru was formed, and as a first ferromagnetic metal layer, a film of 12 nm thick IrMn/10 nm thick CoFe/0.8 nm thick Ru/7 nm thick CoFe was formed in order on thereon. Next, a method of forming a tunnel barrier layer will be shown. A film of 0.1 nm thick Mg/0.2 nm thick $Mg_{0.15}Zn_{0.25}Al_2$/0.15 nm thick Al was formed by sputtering with a Mg target, an Al target, and a target of an alloy composition of $Mg_{0.15}Zn_{0.25}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.1 nm thick Mg/0.2 nm thick $Mg_{0.15}Zn_{0.25}Al_2$ was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

The above-described stacked film was moved again to the film-forming chamber, and a 5 nm thick CoFe film was formed as a second ferromagnetic metal layer 7. A film of 3 nm thick Ru/5 nm thick Ta was formed as a cap layer 4.

The above-described stacked film was installed in an annealing apparatus, and was heated at a temperature of 450° C. in an Ar atmosphere for 10 minutes. Thereafter, under an applied field of 8 kOe, the stacked film was heated at a temperature of 280° C. for 6 hours.

Next, an element was formed as in FIG. 8. First, a photoresist was formed using electron beam lithography in such a way that an electrode layer 5 was in a direction rotated by 90 degrees as in FIG. 9. A part other than a part below the photoresist was eliminated by an ion milling method to expose the thermal silicon oxide film that was the substrate, and thus a shape of the underlayer 2 was formed. In a narrow part in the shape of the underlayer, a photoresist was formed into a cylindrical shape of 80 nm using electron beam lithography, and a part other than a part below the photoresist was eliminated by an ion milling method to expose the underlayer. Thereater, SiOx was formed as an insulating layer on the part shaved by ion milling. Here, the photoresist with a cylindrical shape of 80 nm was removed. The photoresist was not formed only in a part corresponding to an electrode pad of FIG. 9, and the insulating layer was removed by an ion milling method to expose the underlayer. Thereafter, an Au layer was formed. This electrode pad 8 functions as a contact electrode for the underlayer of the above-described stacked film. Next, a photoresist was formed and shaping was performed by an ion milling method such that the electrode layer of FIG. 9 was formed, and an Au layer was formed. This functions as a contact electrode for the electrode layer of the above-described stacked film.

(Characteristic Evaluation of Example 1)

Figure 10:
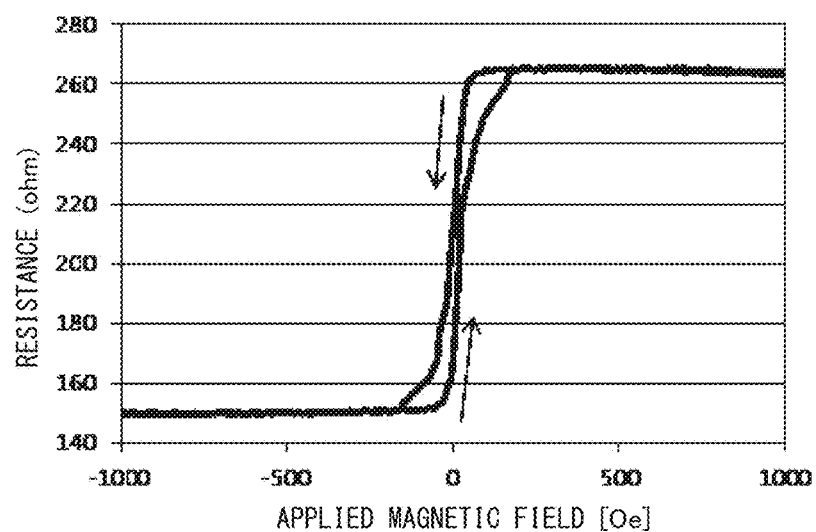
FIG. 10 is a diagram showing results of evaluation of a magnetoresistance effect of a magnetoresistance effect element 100 of Example 1.
Figure 11:
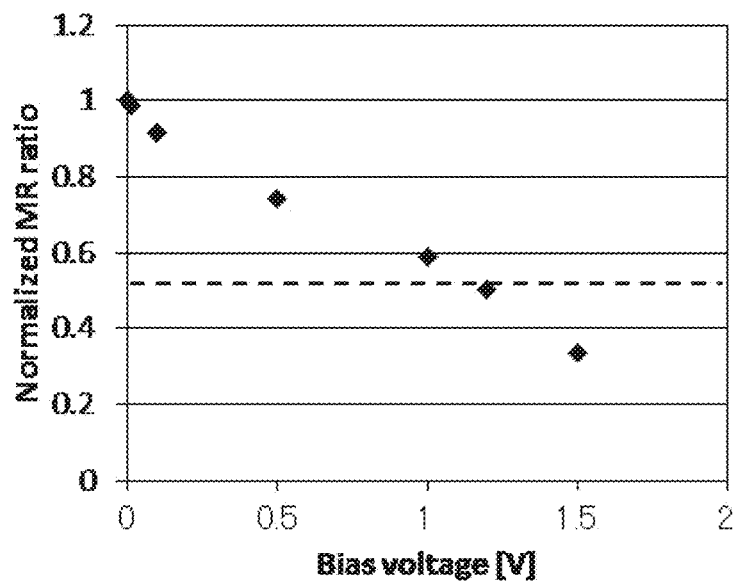
FIG. 11 is a diagram showing results of evaluation of bias voltage dependency of the magnetoresistance effect of the magnetoresistance effect element 100 of Example 1.

The magnetoresistance effect element evaluation method is based on a magnetoresistance effect element evaluation method that has been generally performed. As shown in FIG. 9, a current source and a voltmeter were connected to the electrode pad and the electrode layer, respectively, to perform measurement by a four-terminal method. A bias voltage to be applied from the voltmeter was appropriately changed to 10 to 1500 mV, and a current was measured by the current source to obtain a resistance value. The changing resistance value was observed by applying a magnetic field to the magnetoresistance effect element from outside. FIG. 10 is a diagram showing results of the evaluation of the magnetoresistance effect of the magnetoresistance effect element of Example 1. The horizontal axis represents a magnetic field, and the vertical axis represents the resistance of the element. The bias voltage applied was 1 V, and electrons flowed in a direction from the first ferromagnetic metal layer to the second ferromagnetic layer 7. From FIG. 10, it was found that the MR ratio was 89.2%, and the area resistance (RA) of the element was 0.8 $\Omega\cdot\mu m^2$. FIG. 11 is a diagram showing results of the evaluation of bias voltage dependency of the magnetoresistance effect of the magnetoresistance effect element of Example 1. It is found that in the magnetoresistance effect element of Example 1, the MR ratio is reduced with an increase in the bias voltage. From FIG. 11, it is found that the voltage ($V_{half}$) at which the MR ratio is reduced by half is 1 V.

(Structure Analysis of Example 1)

For structure analysis of the tunnel barrier layer, evaluation was performed with an electron diffraction image obtained using transmission electron beams. Through this method, the structure of the barrier layer was examined, and it was confirmed that there was no reflection from the {022} plane and the {111} plane shown in the ordered spinel structure. In addition, it was found that this barrier had a spinel structure in which cations of cubic crystal were disordered.

(Composition Analysis of Example 1)

The composition of the tunnel barrier layer was analyzed using energy dispersive X-ray analysis (EDS). As a standard of the composition ratio, the content of Al was defined as 2, and relative amounts of Mg and Zn were compared to each other. As a result, Mg:Zn:Al=0.9:0.16:2 was obtained. Quantitativity of O was ignored since it is difficult to perform quantitative evaluation of O. In general, the crystal structure can be maintained even in a case where the amount of O deviates from the quantitative ratio in an oxide.

Example 2

The production method is similar to that in Example 1, but only the material for forming the tunnel barrier layer is different from that of Example 1. A film of 0.05 nm thick Mg/0.05 nm thick Cd/0.2 nm thick $Mg_{0.15}Zn_{0.25}Al_2$/0.15 nm thick Al was formed by sputtering with a Mg target, an Al target, a Cd target, and a target of an alloy composition of $Mg_{0.15}Zn_{0.25}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm thick Mg/0.05 nm thick Cd/0.2 nm thick $Mg_{0.15}Zn_{0.25}Al_2$ was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Example 2)

Figure 12:
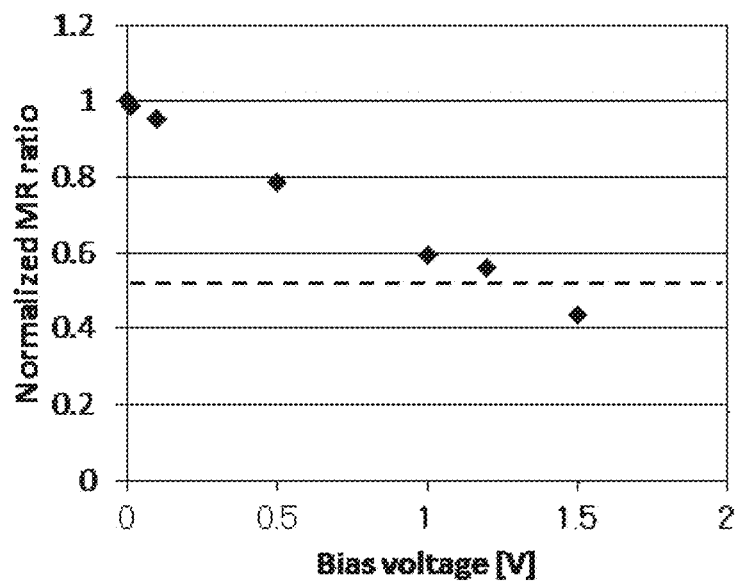
FIG. 12 is a diagram showing results of evaluation of bias voltage dependency of a magnetoresistance effect of a magnetoresistance effect element 100 of Example 2.

As a result of the measurement of the magnetoresistance effect, it was found that in a case where the bias voltage was 1 V, the MR ratio was 89.2%, and the area resistance (RA) of the element was 1.0 $\Omega \cdot \mu m^2$. FIG. 12 is a diagram showing results of the evaluation of bias voltage dependency of the magnetoresistance effect of the magnetoresistance effect element of Example 2. It is found that in the magnetoresistance effect element of Example 2, the MR ratio is reduced with an increase in the bias voltage. From FIG. 12, it is found that the voltage ($V_{half}$) at which the MR ratio is reduced by half is 1.3 V. Relative amounts were compared to each other using EDS, and the result was Mg:Zn:Cd: Al=0.5:0.16:0.4:2. In addition, from an electron beam diffraction image, it was found that the tunnel barrier layer had a spinel structure in which cations of cubic crystal were disordered.

Example 3

The production method is similar to that in Example 1, but only the material for forming the tunnel barrier layer 4 is different from that of Example 1. A film of 0.05 nm thick Mg/0.05 nm thick Pb/0.2 nm thick $Mg_{0.15}Zn_{0.25}Al_2$/0.15 nm thick Al was formed by sputtering with a Mg target, an Al target, a Pb target, and a target of an alloy composition of $Mg_{0.15}Zn_{0.25}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm thick Mg/0.05 nm thick Pb/0.2 nm thick $Mg_{0.15}Zn_{0.25}Al_2$ was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Example 3)

Figure 13:
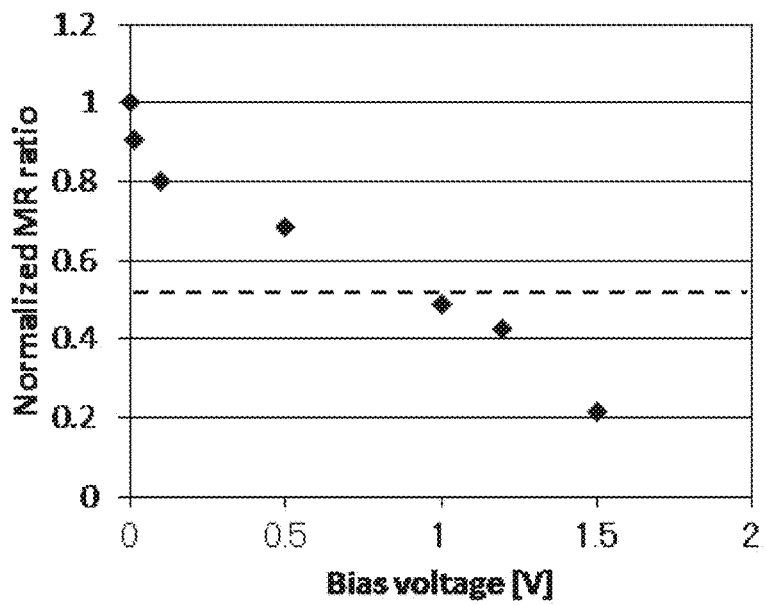
FIG. 13 is a diagram showing results of evaluation of bias voltage dependency of a magnetoresistance effect of a magnetoresistance effect element 100 of Example 3.

As a result of the measurement of the magnetoresistance effect, it was found that in a case where the bias voltage was 1 V, the MR ratio was 58.3%, and the area resistance (RA) of the element was 0.9 $\Omega \cdot \mu m^2$. FIG. 13 is a diagram showing results of the evaluation of bias voltage dependency of the magnetoresistance effect of the magnetoresistance effect element of Example 3. It is found that in the magnetoresistance effect element of Example 2, the MR ratio is reduced with an increase in the bias voltage. From FIG. 13, it is found that the voltage ($V_{half}$) at which the MR ratio is reduced by half is 0.95 V. Relative amounts were compared to each other using EDS, and the result was Mg:Zn:Pb: Al=0.5:0.2:0.4:2. In addition, a cubic structure in which the spinel structure was disordered was confirmed from an electron beam diffraction image.

Example 4

The production method is similar to that in Example 1, but only the material for forming the tunnel barrier layer is different from that of Example 1. A 0.45 nm thick $Ag_{0.5}Pb_{0.5}Al_2$ film was formed by sputtering with a target of an alloy composition of $Ag_{0.5}Pb_{0.5}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 30 seconds, the partial pressure ratio of Ar to oxygen was 1 to 15, and the total gas pressure was 0.05 Pa. Then, the sample was returned to a film-forming chamber, and a 0.3 nm thick $Ag_{0.5}Pb_{0.5}Al_2$ film was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 30 seconds. The partial pressure ratio of Ar to oxygen was 1 to 20, and the total gas pressure was 0.02 Pa.

(Characteristics of Example 4)

Figure 14:
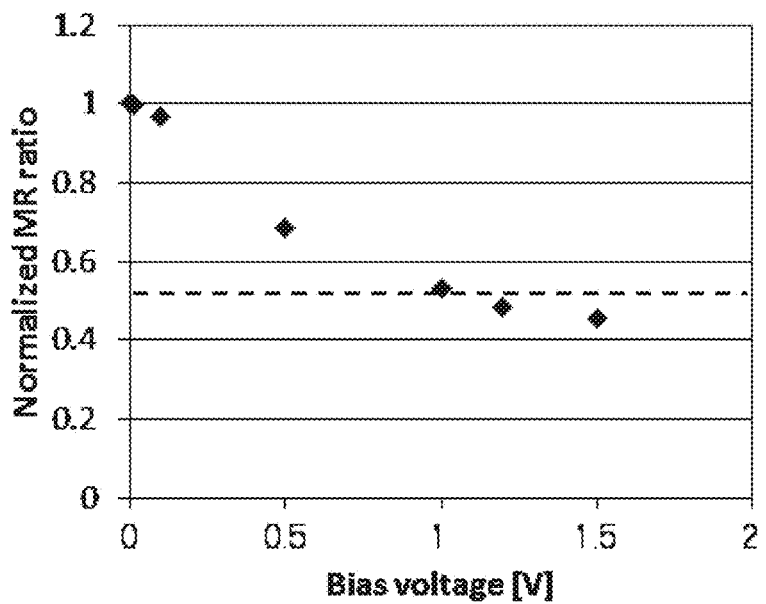
FIG. 14 is a diagram showing results of evaluation of bias voltage dependency of a magnetoresistance effect of a magnetoresistance effect element 100 of Example 4.

As a result of the measurement of the magnetoresistance effect, it was found that in a case where the bias voltage was 1 V, the MR ratio was 63.3%, and the area resistance (RA) of the element was 1 Ω·μm². FIG. 14 is a diagram showing results of the evaluation of bias voltage dependency of the magnetoresistance effect of the magnetoresistance effect element of Example 4. It is found that in the magnetoresistance effect element of Example 4, the MR ratio is reduced with an increase in the bias voltage. From FIG. 14, it is found that the voltage ($V_{half}$) at which the MR ratio is reduced by half is 1 V. Relative amounts were compared to each other using EDS, and the result was Ag:Pb:Al=0.5:0.5:2. In addition, from an electron beam diffraction image, it was found that the tunnel barrier layer had a spinel structure in which cations of cubic crystal were disordered.

Example 5

The production method is similar to that in Example 1, but only the material for forming the tunnel barrier layer 4 is different from that of Example 1. A film of 0.05 nm thick Mg/0.05 nm thick Cd/0.2 nm thick $Mg_{0.1}Zn_{0.5}Al_4$/0.1 nm thick Al was formed by sputtering with a Mg target, an Al target, a Cd target, and a target of an alloy composition of $Mg_{0.1}Zn_{0.5}Al_4$ were subjected to sputtering to form. Thereafter, the above-described sample was moved to an oxidation chamber of which the inside was kept in an ultrahigh vacuum of 1×10⁻⁸ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm thick Mg/0.05 nm thick Cd/0.1 nm of Al/0.2 nm thick $Mg_{0.1}Zn_{0.5}Al_4$ was formed. The above-described sample was moved to the oxidation chamber of which the inside was kept in an ultrahigh vacuum of 1×10⁻⁸ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Example 5)

Figure 15:
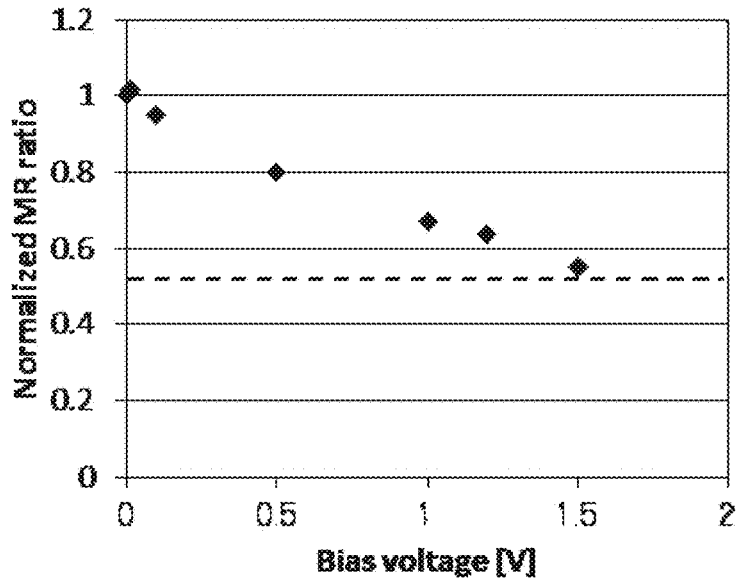
FIG. 15 is a diagram showing results of evaluation of bias voltage dependency of a magnetoresistance effect of a magnetoresistance effect element 100 of Example 5.

As a result of the measurement of the magnetoresistance effect, it was found that in a case where the bias voltage was 1 V, the MR ratio was 124%, and the area resistance (RA) of the element was 0.9 Ω·μm². FIG. 15 is a diagram showing results of the evaluation of bias voltage dependency of the magnetoresistance effect of the magnetoresistance effect element of Example 5. It is found that in the magnetoresistance effect element of Example 5, the MR ratio is reduced with an increase in the bias voltage. From FIG. 15, it is found that the voltage ($V_{half}$) at which the MR ratio is reduced by half is 1.55 V. Relative amounts were compared to each other using EDS, and the result was Mg:Zn:Cd:Al=0.4:0.16:0.37:2. In addition, from an electron beam diffraction image, it was found that the tunnel barrier layer had a spinel structure in which cations of cubic crystal were disordered.

Example 6

The production method is similar to that in Example 5, but only the material for forming the first ferromagnetic metal layer is different from that of Example 5. A material having an alloy composition of $Co_2Mn_{0.7}Fe_{0.3}Si_{0.66}Al_{0.36}$ was used in place of CoFe to form a film. A film of 12 nm thick IrMn/10 nm thick CoFe/0.8 nm thick Ru/2 nm of CoFe/5 nm thick $Co_2Mn_{0.7}Fe_{0.3}Si_{0.66}Al_{0.36}$ was formed in order as a first ferromagnetic metal layer 6. Only when a film was formed using the material of an alloy composition of $Co_2Mn_{0.7}Fe_{0.3}Si_{0.66}Al_{0.36}$, the substrate was heated at 450 degrees. In addition, before the formation of the tunnel barrier layer, the heat of the substrate was sufficiently radiated to lower the temperature of the substrate to about the room temperature, and then the subsequent film forming process was performed.

(Characteristics of Example 6)

Figure 16:
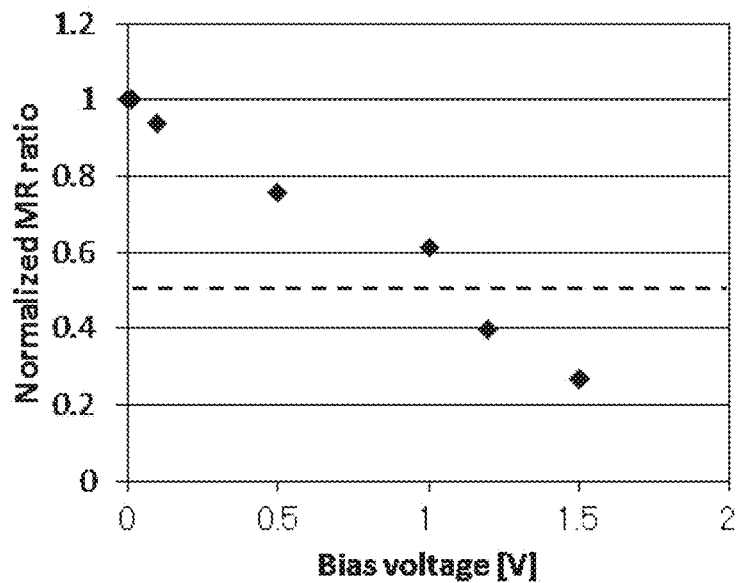
FIG. 16 is a diagram showing results of evaluation of bias voltage dependency of a magnetoresistance effect of a magnetoresistance effect element 100 of Example 6.

As a result of the measurement of the magnetoresistance effect, it was found that in a case where the bias voltage was 1 V, the MR ratio was 179.9%, and the area resistance (RA) of the element was 0.9 Ω·μm². FIG. 16 is a diagram showing results of the evaluation of bias voltage dependency of the magnetoresistance effect of the magnetoresistance effect element of Example 6. It is found that in the magnetoresistance effect element of Example 5, the MR ratio is reduced with an increase in the bias voltage. From FIG. 16, it is found that the voltage ($V_{half}$) at which the MR ratio is reduced by half is 1.1 V. In addition, from an electron beam diffraction image, it was found that the tunnel barrier layer had a spinel structure in which cations of cubic crystal were disordered.

Example 7

The production method is similar to that in Example 1, but only the material for forming the tunnel barrier layer is different. A 0.4 nm thick film, in which a composition ratio of Al to the sum of Mg and Zn was 0.9:2 and the Mg and Zn were included at an arbitrary composition ratio, was formed by simultaneously sputtering with a Mg target, a Zn target, and an Al target. Thereafter, the above-described sample was moved to an oxidation chamber of which the inside was kept in an ultrahigh vacuum of 1×10⁻⁸ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film with a thickness of 0.4 nm was formed such that a composition ratio of Al to the sum of Mg and Zn was 0.9:2. The above-described sample was moved to the oxidation chamber of which the inside was kept in an ultrahigh vacuum of 1×10⁻⁸ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Example 7)

Figure 17:
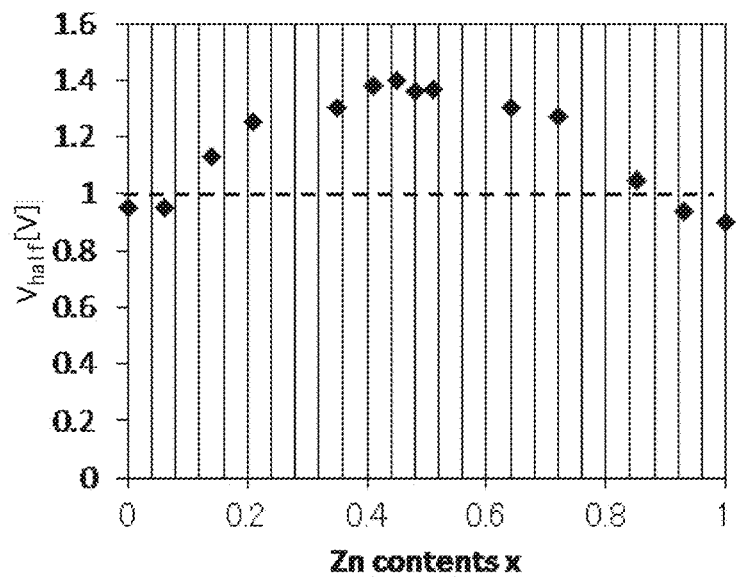
FIG. 17 is a diagram obtained by plotting $V_{half}$ obtained from results of measurement of a magnetoresistance effect of Example 7 and the amount of Zn in divalent cations obtained from EDS.

FIG. 17 is a diagram obtained by plotting $V_{half}$ obtained from the results of the measurement of the magnetoresistance effect of Example 7 and the amount of Zn in the divalent cations obtained from EDS. The composition ratio of Al to the sum of Mg and Zn was confirmed to be 0.9:2 at any composition ratio. The bias voltage is 1 V In addition, a cubic structure in which the spinel structure was disordered was confirmed from an electron beam diffraction image. From FIG. 17, it is found that at a composition ratio of $(Mg_xZn_{1-x})_{0.9}Al_2O_4$, $V_{half}$ is 1 V or greater in a case where x is 0.125 to 0.9. In addition, it is found that a peak is shown in a case where the concentration of Zn in the non-magnetic divalent cations is 45%. The ionic radius of $Zn^{2+}$ is 0.6 Å, and the ionic radius of $Mg^{2+}$ is 0.57 Å. That is, it is possible to obtain high $V_{half}$ in a tunnel barrier layer in which an element having a large ionic radius is included in a proportion of 12.5% to 90% in the non-magnetic divalent cations.

Example 8

The production method is similar to that in Example 1, but only the material for forming the tunnel barrier layer is different from that of Example 1. A 0.4 nm thick film, in which divalent cations and aluminum were included at an arbitrary composition ratio, was formed by simultaneously sputtering with a target of an alloy composition of $Mg_{0.55}Zn_{0.45}$ and an Al target. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a 0.4 nm thick film, in which divalent cations and aluminum were included at an arbitrary composition ratio, was formed by simultaneously sputtering with a target having an alloy composition of $Mg_{0.55}Zn_{0.45}$ and an Al target. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Example 8)

Figure 18:
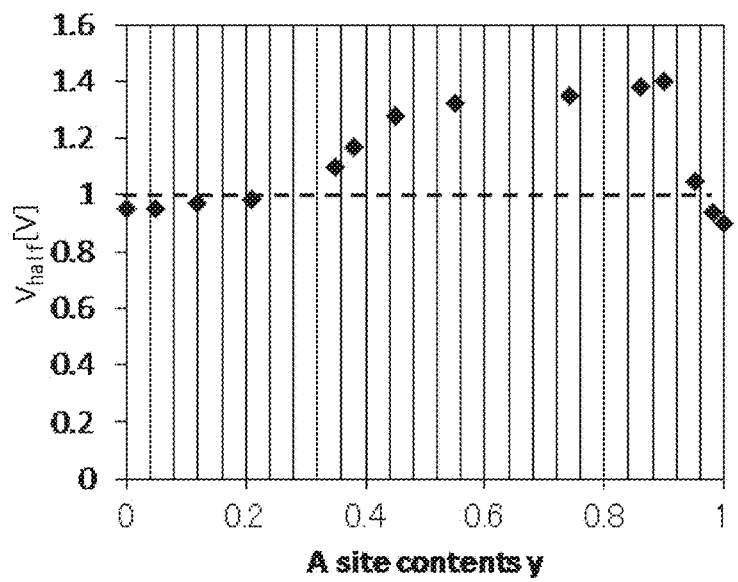
FIG. 18 is a diagram obtained by plotting $V_{half}$ obtained from results of measurement of a magnetoresistance effect of Example 8 and the amount of an A-site obtained from EDS.

FIG. 18 is a diagram obtained by plotting $V_{half}$ obtained from the results of the measurement of the magnetoresistance effect of Example 8 and the amount of an A-site obtained from EDS. The composition ratio of Mg to Zn was confirmed to be 0.55:0.45 at any composition ratio. The bias voltage is 1 V. In addition, a cubic structure in which the spinel structure was disordered was confirmed from an electron beam diffraction image. From FIG. 18, it is found that at a composition ratio of $(Mg_{0.55}Zn_{0.45})_yAl_2O_4$, $V_{half}$ is 1 V or greater in a case where y is 0.3 to 0.95. In a case where the divalent cation of the non-magnetic element is in a proportion of 15% to 42.5% with respect to the aluminum ion in the tunnel barrier layer, the cations are efficiently disordered, and thus a reduction in $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs. That is, it is possible to obtain high $V_{half}$ in a tunnel barrier layer in which the divalent cation of the non-magnetic element is included in a proportion of 15% to 42.5% with respect to the aluminum ion.

Example 9

The production method is similar to that in Example 7, but only the material for forming the first ferromagnetic metal layer is different from that of Example 2. A material having an alloy composition of $Co_2Mn_{0.7}Fe_{0.3}Si_{0.66}Al_{0.36}$ was used in place of CoFe to form a film. A film of 12 nm thick IrMn/10 nm thick CoFe/0.8 nm thick Ru/2 nm thick CoFe/5 nm thick $Co_2Mn_{0.7}Fe_{0.3}Si_{0.66}Al_{0.36}$ was formed in order as a first ferromagnetic metal layer 6. Only when a film was formed using the material of an alloy composition of $Co_2Mn_{0.7}Fe_{0.3}Si_{0.66}Al_{0.36}$, the substrate was heated at 450 degrees. In addition, before the formation of the tunnel barrier layer, the heat of the substrate was sufficiently radiated to lower the temperature of the substrate to about the room temperature, and then the subsequent film forming process was performed.

(Characteristics of Example 9)

Figure 19:
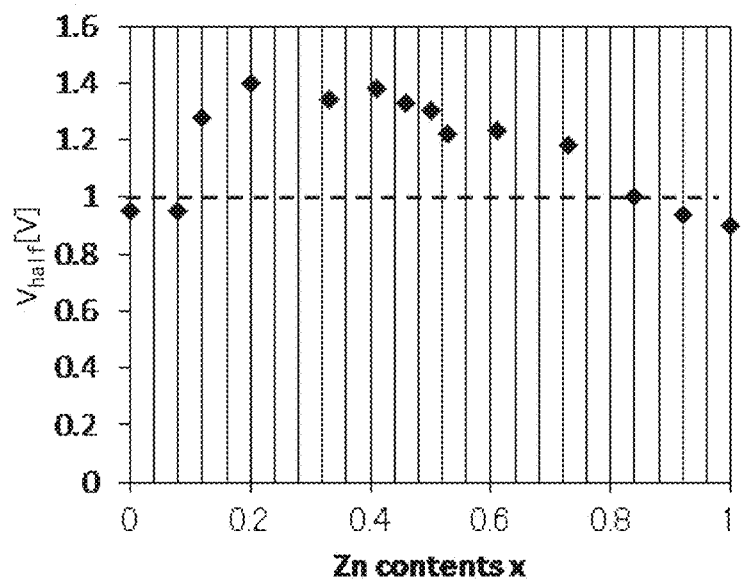
FIG. 19 is a diagram obtained by plotting $V_{half}$ obtained from results of measurement of a magnetoresistance effect of Example 9 and the amount of Zn in divalent cations obtained from EDS.

FIG. 19 is a diagram obtained by plotting $V_{half}$ obtained from the results of the measurement of the magnetoresistance effect of Example 9 and the amount of Zn in the divalent cations obtained from EDS. The composition ratio of Al to the sum of Mg and Zn was confirmed to be 0.9:2 at any composition ratio. The bias voltage is 1 V. In addition, a cubic structure in which the spinel structure was disordered was confirmed from an electron beam diffraction image. From FIG. 19, it is found that at a composition ratio of $(Mg_xZn_{1-x})_{0.9}Al_2O_4$, $V_{half}$ is 1 V or greater in a case where x is 0.125 to 0.85. In addition, it is found that a peak is shown in a case where the concentration of Zn in the non-magnetic divalent cations is 20%. The ionic radius of $Zn^{2+}$ is 0.6 Å, and the ionic radius of $Mg^{2+}$ is 0.57 Å. That is, it is possible to obtain high $V_{half}$ in a tunnel barrier layer in which an element having a large ionic radius is included in a proportion of 12.5% to 85% in the non-magnetic divalent cations.

Example 10

The production method is similar to that in Example 8, but only the material for forming the first ferromagnetic metal layer is different from that of Example 8. A material of an alloy composition of $Co_2Mn_{0.7}Fe_{0.3}Si_{0.66}Al_{0.36}$ was used in place of CoFe to form a film. A film of 12 nm thick IrMn/10 nm thick CoFe/0.8 nm thick Ru/2 nm thick CoFe/5 nm thick $Co_2Mn_{0.7}Fe_{0.3}Si_{0.66}Al_{0.36}$ was formed in order as a first ferromagnetic metal layer 6. Only when a film was formed using the material of an alloy composition of $Co_2Mn_{0.7}Fe_{0.3}Si_{0.66}Al_{0.36}$, the substrate was heated at 450 degrees. In addition, before the formation of the tunnel barrier layer, the heat of the substrate was sufficiently radiated to lower the temperature of the substrate to about the room temperature, and then the subsequent film forming process was performed.

(Characteristics of Example 10)

Figure 20:
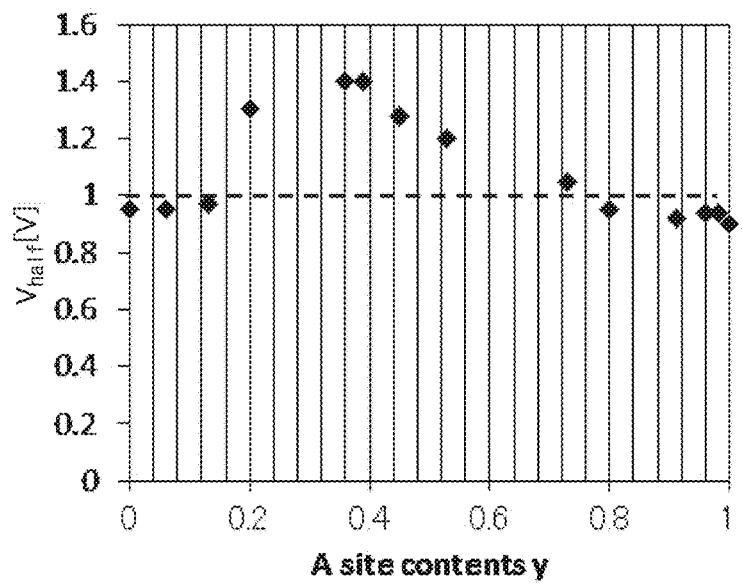
FIG. 20 is a diagram obtained by plotting $V_{half}$ obtained from results of measurement of a magnetoresistance effect of Example 10 and the amount of an A-site obtained from EDS.

FIG. 20 is a diagram obtained by plotting $V_{half}$ obtained from the results of the measurement of the magnetoresistance effect of Example 10 and the amount of an A-site obtained from EDS. The composition ratio of Mg to Zn was confirmed to be 0.55:0.45 at any composition ratio. The bias voltage is 1 V. In addition, a cubic structure in which the spinel structure was disordered was confirmed from an electron beam diffraction image. From FIG. 20, it is found that at a composition ratio of $(Mg_{0.55}Zn_{0.45})_yAl_2O_4$, $V_{half}$ is 1 V or greater in a case where y is 0.15 to 0.75. In a case where the divalent cation of the non-magnetic element is in a proportion of 7.5% to 37.5% with respect to the aluminum ion in the tunnel barrier layer, the cations are efficiently disordered, and thus a reduction in $V_{half}$ is suppressed with respect to the bias voltage. In addition, this $V_{half}$ is 1 V or greater, and the magnetoresistance effect element can also be used in devices to which a high bias voltage is applied, such as high-sensitivity magnetic sensors, logic-in-memories, and MRAMs. That is, it is possible to obtain high $V_{half}$ in a tunnel barrier layer in which the divalent cation of the non-magnetic element is included in a proportion of 17.5% to 37.5% with respect to the aluminum ion.

Example 11

The production method is similar to that in Example 1, but the composition ratio of the tunnel barrier layer and the method for forming the tunnel barrier layer are different from that of Example 1. Film formation was performed on a substrate provided with a thermal silicon oxide film using a magnetron sputtering method. As an underlayer, a film of 5 nm thick Ta/3 nm thick Ru was formed, and as a first ferromagnetic metal layer, a film of 12 nm thick IrMn/10 nm thick CoFe/0.8 nm thick Ru/7 nm thick CoFe was formed in order thereon. Next, a method of forming a tunnel barrier layer will be shown. A film of 0.2 nm thick Mg/0.4 nm of $Mg_{0.15}Zn_{0.125}Al_2$/0.3 nm thick Al was formed by sputtering with a Mg target, an Al target, and a target of an alloy composition of $Mg_{0.15}Zn_{0.125}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was treated for 10 minutes at 330° C. to 400° C. in an Ar atmosphere, and then returned to a film-forming chamber, and a film of 0.2 nm thick Mg/0.4 nm thick $Mg_{0.15}Zn_{0.125}Al_2$ was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

The above-described stacked film was moved again to the film-forming chamber, and 5 nm of CoFe was formed as a second ferromagnetic metal layer 7. 3 nm of Ru/5 nm of Ta was formed as a cap layer 4.

The above-described stacked film was installed in an annealing apparatus, and was heated at a temperature of 450° C. in an Ar atmosphere for 10 minutes. Then, in a state in which a magnetic field of 8 kOe was applied, the stacked film was heated at a temperature of 280° C. for 6 hours.

(Cross-Section Analysis of Example 11)

The volume ratio of the lattice-matched part (lattice-matched portion) with respect to the volume of the entire tunnel barrier layer was calculated as described above using a cross-section transmission electron microscope (TEM) image and an image obtained by removing electron beam diffraction spots in a direction other than a stacking direction in an electron beam diffraction image obtained by Fourier-transforming the TEM image and by then performing inverse Fourier transformation.

Figure 22:
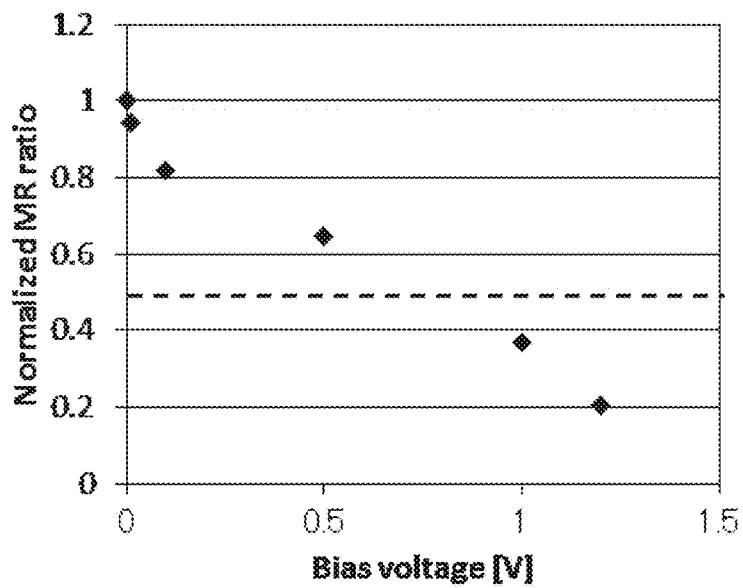
FIG. 22 is a diagram showing results of evaluation of bias voltage dependency of a magnetoresistance effect of a magnetoresistance effect element 100 of Comparative Example 2.

FIG. 22 is a structural schematic diagram of a cross-section including a direction parallel to the stacking direction of Example 11. From the high-resolution cross-section TEM image obtained in Example 9, it was found that a size (width) of the film surface of the lattice-matched part of the tunnel barrier layer in a direction parallel thereto was 30 nm or less in any part. 30 nm is about 10 times the lattice constant of the CoFe alloy that is the material of the first ferromagnetic metal layer and the second ferromagnetic metal layer, and mutual interference of the spin-polarized electrons in a direction perpendicular to the tunneling direction before or after coherent tunneling can be thought to be intensified about 10 times the lattice constant.

Figure 26:
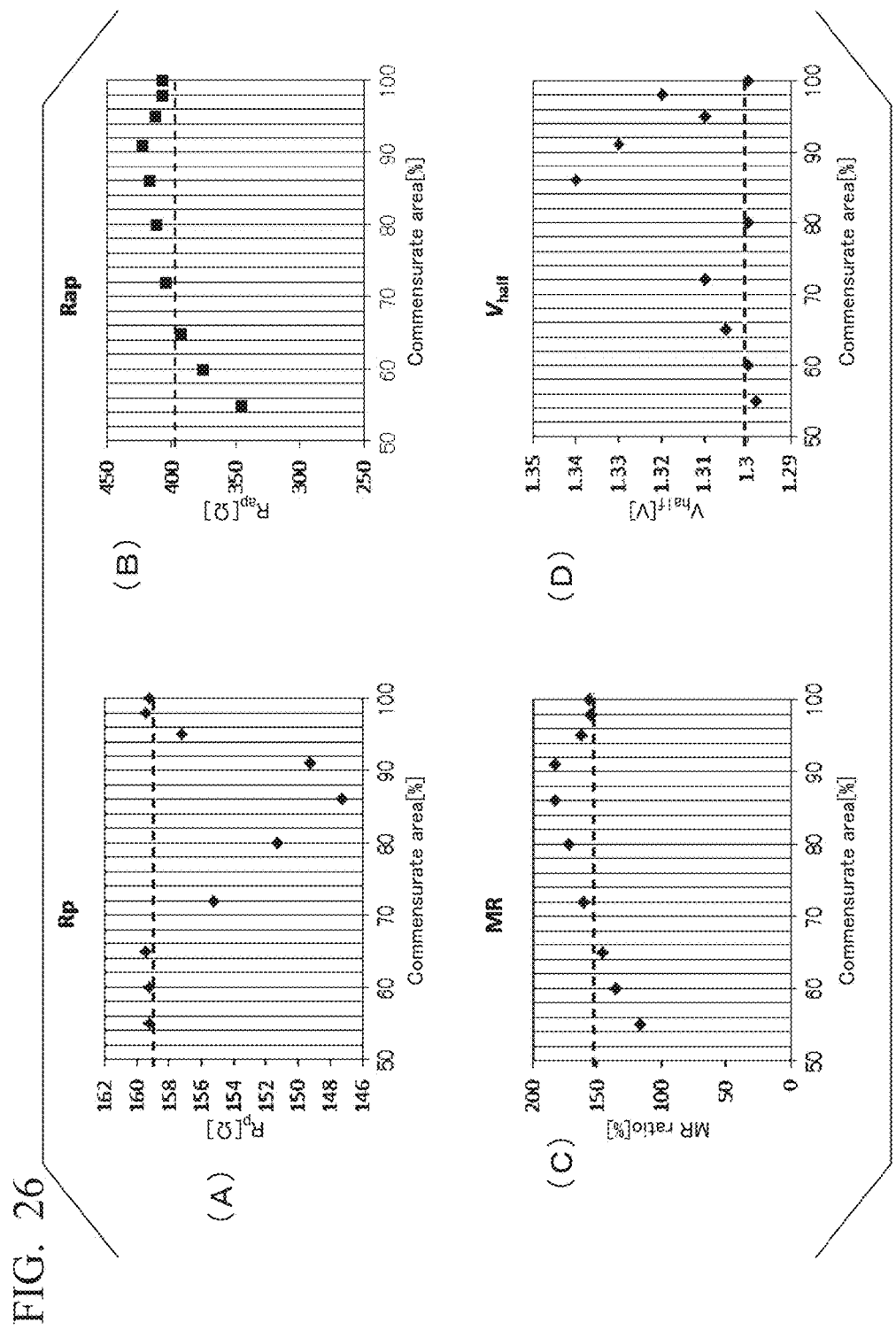
FIG. 26 is a diagram showing a proportion of a lattice-matched portion in which a tunnel barrier layer of Example 11 is lattice-matched with both of a first ferromagnetic metal layer and a second ferromagnetic metal layer, and characteristics of an element.

FIG. 26 is a diagram showing the volume ratio of the lattice-matched part (lattice-matched portion) with respect to the volume of the entire tunnel barrier layer of Example 11 and characteristics of the element. FIG. 26(A) is a diagram showing element resistance (Rp) when magnetization directions of the first ferromagnetic metal layer and the second ferromagnetic metal layer are parallel to each other. FIG. 26(B) is a diagram showing element resistance (Rap) when magnetization directions of the first ferromagnetic metal layer and the second ferromagnetic metal layer are antiparallel to each other. FIG. 26(C) is a diagram showing a magnetoresistance ratio of the element. FIG. 26(D) is a diagram showing $V_{half}$ of the element. The Rp tends to be reduced when the proportion of the lattice-matched part in which the tunnel barrier layer is lattice-matched to both of the first ferromagnetic metal layer and the second ferromagnetic metal layer is in the range of 65% to 95%. Regarding this, in a case where the tunnel barrier layer is completely lattice-matched, spin-polarized electrons interfere with each other during passing through the tunnel barrier layer, and thus it is thought that that the electrons do not easily pass through the tunnel barrier layer. In contrast, in a case where the lattice-matched parts, in which lattices are matched, partially exists, the interference of spin-polarized electrons during passing through the tunnel barrier layer is appropriately cut in a part in which lattices are not matched, and thus the spin-polarized electrons easily pass through the tunnel barrier layer. As a result, it is thought that a tendency of a reduction in the Rp is observed. At the same time, a tendency of a slight increase in the Rap is observed when the proportion of the lattice-matched portion is in the range of 65% to 95%. This indicates that even when the magnetization directions of the first ferromagnetic metal layer and the second ferromagnetic metal layer are antiparallel to each other, interference between domains is eased, and it is found that the spin-polarized electrons passing through the tunnel barrier layer effectively act by magnetic scattering. As a result, the MR ratio is increased in a case where the proportion of the lattice-matched part is 65% to 95%. In this range, $V_{half}$ tends to slightly increase, but the change is very small.

Example 12

The production method is similar to that in Example 11, but only the film thickness of the tunnel barrier layer is different from that of Example 11. The film thickness was adjusted such that the film thickness ratio of each material provided in Example 11 was maintained. That is, a film of 0.2×Z nm thick Mg/0.4×Z nm thick $Mg_{0.15}Zn_{0.125}Al_2$/0.3×Z nm thick Al was formed by sputtering with a Mg target, an Al target, and a target of an alloy composition of $Mg_{0.15}Zn_{0.125}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was treated for 10 minutes at 380° C. in an Ar atmosphere, and then returned to a film-forming chamber, and a film of 0.2×Z nm thick Mg/0.4×Z nm thick $Mg_{0.15}Zn_{0.125}Al_2$ was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa. Z was arbitrarily set in the range of 0.4 to 1.4, and a film thickness (t) was estimated using a cross-section TEM image.

(Characteristics of Example 12)

Figure 27:
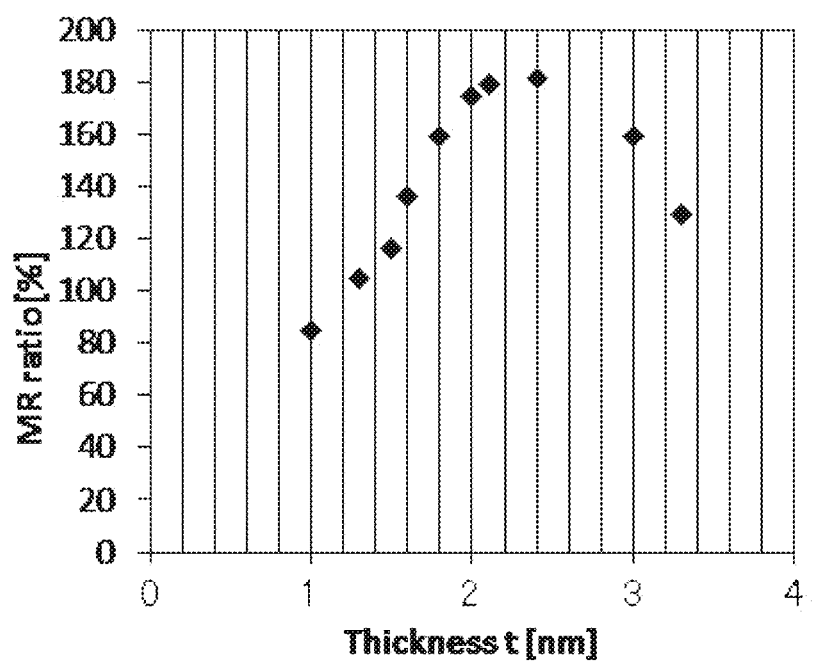
FIG. 27 is a diagram showing the relationship between a film thickness and a magnetoresistance ratio of an element obtained in Example 12.

FIG. 27 is a diagram showing the relationship between the film thickness and the magnetoresistance ratio of the element obtained in Example 12. In Example 12, it was found that the proportion of the lattice-matched part was 90% to 95% from the cross-section TEM image. The magnetoresistance ratio is increased with an increase in the film thickness of the tunnel barrier layer, and becomes the maximum at a film thickness of 2.4 nm. Particularly, a rapid increase in the magnetoresistance ratio was confirmed at a film thickness of 1.7 nm or greater. The reason for this is thought to be that due to the increase in the film thickness, the influence of interference between spin-polarized electrons during passing through the tunnel barrier layer is reduced, and the spin-polarized electrons easily pass through the tunnel barrier layer. In addition, in a case where the film thickness is greater than 3.0 nm, the influence of an increase in the resistance due to the film thickness of the tunnel barrier layer is increased, and thus a tendency of a reduction in the magnetoresistance ratio is observed. That is, it is found that an optimum film thickness of the tunnel barrier layer is 1.7 nm to 3.0 nm in order to obtain a high magnetoresistance ratio.

Comparative Example 1

The production method is similar to that in Example 1, but only the material for forming the tunnel barrier layer 4 is different that of Example 1. A 0.45 nm thick Mg film ws formed by sputtering with a Mg target. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a 0.4 nm thick Mg film was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Comparative Example 1)

Figure 21:
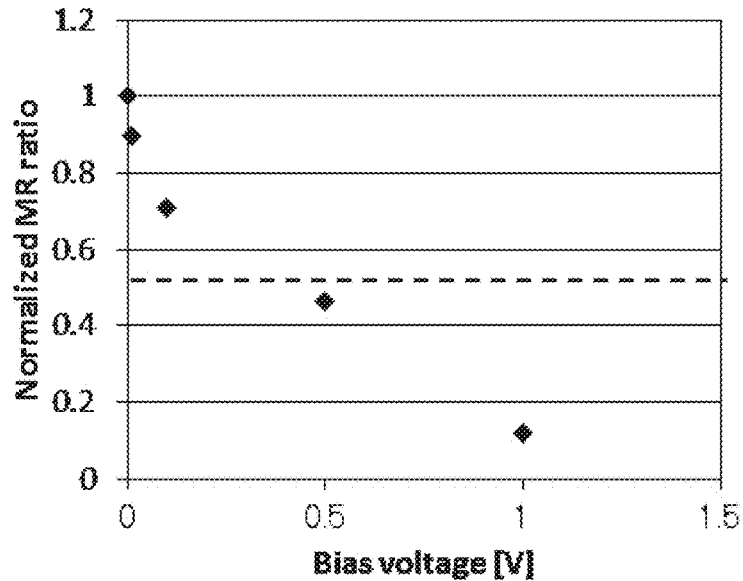
FIG. 21 is a diagram showing results of evaluation of bias voltage dependency of a magnetoresistance effect of a magnetoresistance effect element 100 of Comparative Example 1.

As a result of the measurement of the magnetoresistance effect, it was found that in a case where the bias voltage was 1 V, the MR ratio was 27%, and the area resistance (RA) of the element was 0.6 $\Omega\cdot\mu m^2$. FIG. 21 is a diagram showing results of the evaluation of bias voltage dependency of the magnetoresistance effect of the magnetoresistance effect element of Comparative Example 1. It is found that in the magnetoresistance effect element of Comparative Example 1, the MR ratio is reduced with an increase in the bias voltage. From FIG. 21, it is found that the voltage ($V_{half}$) at which the MR ratio is reduced by half is 0.45 V. In addition, a spinel structure was confirmed from an electron beam diffraction image.

Comparative Example 2

The production method is similar to that in Example 1, but only the material for forming the tunnel barrier layer 4 is different that of Example 1. A film of 0.05 nm thick Mg/0.05 nm thick Zn/0.25 nm thick $Mg_{0.15}Zn_{0.25}Al_2$/0.1 nm thick Al was formed by sputtering with a Mg target, an Al target, and a target of an alloy composition of $Mg_{0.5}Zn_{0.5}Al_2$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm/0.05 nm of Zn/0.2 nm of $Mg_{0.15}Zn_{0.25}Al_2$/0.1 nm of Al was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Comparative Example 2)

As a result of the measurement of the magnetoresistance effect, it was found that in a case where the bias voltage was 1 V, the MR ratio was 46.3%, and the area resistance (RA) of the element was 0.8 $\Omega\cdot\mu m^2$. FIG. 22 is a diagram showing results of the evaluation of bias voltage dependency of the magnetoresistance effect of the magnetoresistance effect element of Comparative Example 2. It is found that in the magnetoresistance effect element of Example 2, the MR ratio is reduced with an increase in the bias voltage. From FIG. 22, it is found that the voltage ($V_{half}$) at which the MR ratio is reduced by half is 0.7 V. Relative amounts were compared to each other using EDS, and the result was Mg:Zn:Al=0.5:0.5:2. In addition, a spinel structure was confirmed from an electron beam diffraction image.

Comparative Example 3

The production method is similar to that in Example 1, but only the material for forming the tunnel barrier layer 4 is different that of Example 1. A film of 0.05 nm thick Mg/0.25 nm thick $Mg_{0.5}Zn_{0.5}AlGa$/0.1 nm thick Al was formed by sputtering with a Mg target, an Al target, and a target of an alloy composition of $Mg_{0.5}Zn_{0.5}AlGa$. Thereafter, the above-described sample was moved to an oxidation chamber of which the inside was kept in an ultrahigh vacuum of $1\times10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of 0.05 nm of Mg/0.2 nm of $Mg_{0.5}Zn_{0.5}AlGa$/0.1 nm of Al was formed. The above-described sample was moved to the oxidation chamber of which the inside was kept in an ultrahigh vacuum of $1\times10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Comparative Example 3)

Figure 23:
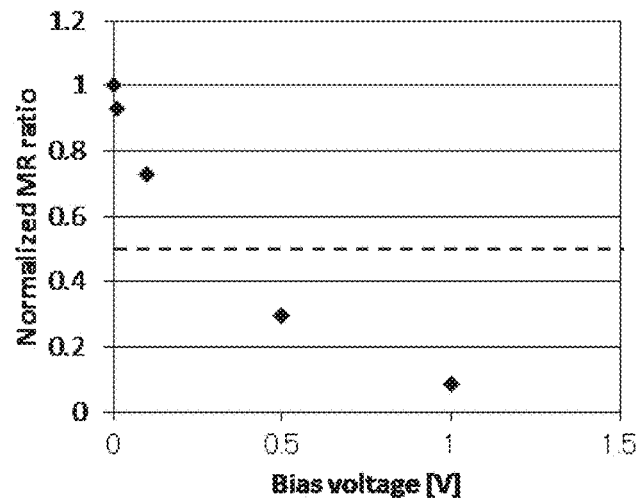
FIG. 23 is a diagram showing results of evaluation of bias voltage dependency of a magnetoresistance effect of a magnetoresistance effect element 100 of Comparative Example 3.

As a result of the measurement of the magnetoresistance effect, it was found that in a case where the bias voltage was 1 V, the MR ratio was 11.2%, and the area resistance (RA) of the element was 0.95 Ω·μm². FIG. 23 is a diagram showing results of the evaluation of bias voltage dependency of the magnetoresistance effect of the magnetoresistance effect element of Comparative Example 3. It is found that in the magnetoresistance effect element of Comparative Example 3, the MR ratio is reduced with an increase in the bias voltage. From FIG. 23, it is found that the voltage ($V_{half}$) at which the MR ratio is reduced by half is 0.3 V. Relative amounts were compared to each other using EDS, and the result was Mg:Zn:Al:Ga=0.5:0.5:1:1. In addition, a spinel structure was confirmed from an electron beam diffraction image.

Comparative Example 4

The production method is similar to that in Example 1, but only the material for forming the tunnel barrier layer 4 is different that of Example 1. A 0.45 nm thick $MgMn_2$ film was formed by sputtering with a target of an alloy composition of $MgMn_2$. Thereafter, the above-described sample was moved to an oxidation chamber of which the inside was kept in an ultrahigh vacuum of $1×10^{-8}$ Pa or less to perform natural oxidation by introducing Ar and oxygen. The natural oxidation time was 10 seconds, the partial pressure ratio of Ar to oxygen was 1 to 25, and the total gas pressure was 0.05 Pa. Then, the sample was returned to a film-forming chamber, and a film of $MgMn_2$ with a thickness of 0.4 nm was formed. The above-described sample was moved to the oxidation chamber of which the inside was kept in an ultrahigh vacuum of $1×10^{-8}$ Pa or less to perform natural oxidation and inductively coupled plasma oxidation by introducing Ar and oxygen. The natural oxidation time was 30 seconds, and the inductively coupled plasma oxidation time was 5 seconds. The partial pressure ratio of Ar to oxygen was 1 to 20, and the total gas pressure was 0.08 Pa.

(Characteristics of Comparative Example 4)

As a result of the measurement of the magnetoresistance effect, it was found that in a case where the bias voltage was 1 V, the MR ratio was not observed, and the area resistance (RA) of the element was 3 Ω·μm². In addition, a spinel structure was confirmed from an electron beam diffraction image.

(Comparison of Examples with Comparative Examples)

Table 1 shows the examples and the comparative examples.

TABLE 1

| EXAMPLES | RA [Ω·μm²] | MR Ratio [%] | $V_{half}$ [V] |
|---|---|---|---|
| EXAMPLE 1 | 0.80 | 89.2 | 1.00 |
| EXAMPLE 2 | 1.00 | 101.6 | 1.30 |
| EXAMPLE 3 | 0.90 | 58.3 | 0.95 |
| EXAMPLE 4 | 1.03 | 63.3 | 1.00 |
| EXAMPLE 5 | 0.90 | 124.0 | 1.55 |
| EXAMPLE 6 | 0.9 | 179.9 | 1.1 |
| COMPARATIVE EXAMPLES | | | |
| COMPARATIVE EXAMPLES 1 | 0.59 | 27.1 | 0.45 |
| COMPARATIVE EXAMPLES 2 | 0.80 | 46.3 | 0.70 |
| COMPARATIVE EXAMPLES 3 | 0.95 | 11.2 | 0.30 |
| COMPARATIVE EXAMPLES 4 | 3.00 | 0.0 | 0.00 |

In a case where Examples are compared with Comparative Examples, it is found that the examples have better characteristics than Comparative Examples in terms of the MR ratio and $V_{half}$. Particularly, in a case where Example 2 is compared with Example 3, the MR ratio in Example 2 is about twice that in Example 3 and $V_{half}$ in Example 2 is 1.3 times that in Example 3. These differences are examined by the difference in ionic radius between plural divalent cations. The divalent cations of Examples 2 and 3 are shown in Table 2.

TABLE 2

| ION | IONIC RADIUS [Å] |
|---|---|
| $Mg^{2+}$ | 0.57 |
| $Cd^{2+}$ | 0.78 |
| $Zn^{2+}$ | 0.6 |
| $Pb^{2+}$ | 0.98 |

The value of the ionic radius is quoted from Non Patent Document 2. The difference in ionic radius between the divalent cations of Example 2 is 0.03 Å, and the difference in ionic radius between the divalent cations of Example 3 is 0.41 Å. In a case where the difference in ionic radius is small, there is no reason for the cations to be periodically arranged since these are regarded to be equivalent in the crystal structure. Thus, the divalent cations are randomly disposed in the crystal. This is associated with Example 2. In a case where the difference in ionic radius is large, lattice distortion is relaxed as much as possible in the crystal lattice, and thus the crystal lattice is stabilized in a case where the cations are periodically arranged. That is, the divalent cations are likely to be periodically arranged. This is associated with Example 3. From these facts, it is found that the characteristics are improved in a case where the difference in ionic radius between the divalent cations of the plural non-magnetic elements is 0.2 Å or less.

INDUSTRIAL APPLICABILITY

The invention can be applied to a magnetoresistance effect element that obtains a higher MR ratio than a TMR element using a conventional spinel tunnel barrier at a high bias voltage.

DESCRIPTION OF THE REFERENCE SYMBOLS

100: MAGNETORESISTANCE EFFECT ELEMENT
1: SUBSTRATE
2: UNDERLAYER
3: TUNNEL BARRIER LAYER
4: CAP LAYER
5: ELECTRODE LAYER
6: FIRST FERROMAGNETIC METAL LAYER
7: SECOND FERROMAGNETIC METAL LAYER
8: ELECTRODE PAD
71: CURRENT SOURCE
72: VOLTMETER

The invention claimed is:
1. A magnetoresistance effect element comprising:
a first ferromagnetic metal layer;
a second ferromagnetic metal layer; and
a tunnel barrier layer that is sandwiched between the first and second ferromagnetic metal layers,
wherein the tunnel barrier layer is expressed by a composition formula of $AB_2O_x$ (0<x≤4), and has a spinel structure in which cations are arranged in a disordered manner,
the tunnel barrier layer has a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer, A is a divalent cation of plural non-magnetic elements, B is an aluminum ion, and in the composition formula, the number of the divalent cation is smaller than half the number of the aluminum ion.

2. The magnetoresistance effect element according to claim 1, wherein a volume ratio of the lattice-matched portion with respect to a volume of the entire tunnel barrier layer is 65% to 95%.

3. The magnetoresistance effect element according to claim 1, wherein the divalent cation of the non-magnetic element is in a proportion of 15% to 42.5% with respect to the aluminum ion.

4. The magnetoresistance effect element according to claim 1, wherein the tunnel barrier layer has a cubic structure as a basic structure.

5. The magnetoresistance effect element according to claim 1, wherein in the non-magnetic element, the divalent cation is any one selected from the group consisting of Mg, Zn, Cd, Ag, Pt, and Pb.

6. The magnetoresistance effect element according to claim 1, wherein the first ferromagnetic metal layer has larger coercivity than the second ferromagnetic metal layer.

7. The magnetoresistance effect element according to claim 1, wherein at least one of the first ferromagnetic metal layer and the second ferromagnetic metal layer has magnetic anisotropy perpendicular to a stacking direction.

8. The magnetoresistance effect element according to claim 1, wherein at least one of the first ferromagnetic metal layer and the second ferromagnetic metal layer is $Co_2Mn_{1-a}Fe_aAl_bSi_{1-b}$ ($0 \le a \le 0 \le b \le 1$).

9. The magnetoresistance effect element according to claim 1, wherein the divalent cation of the non-magnetic element is in a proportion of 7.5% to 37.5% with respect to the aluminum ion.

10. The magnetoresistance effect element according to claim 1, wherein a size of a film surface of the lattice-matched portion of the tunnel barrier layer in a direction parallel thereto is 30 nm or less.

11. The magnetoresistance effect element according to claim 1, wherein the tunnel barrier layer has a film thickness of 1.7 nm to 3.0 nm.

12. The magnetoresistance effect element according to claim 1, wherein an element having the largest ionic radius among elements included in the divalent cation of the non-magnetic element is included in a proportion of 12.5% to 90% in the divalent cation of the non-magnetic element.

13. The magnetoresistance effect element according to claim 1, wherein the lattice-matched portion includes a plurality of continuously connected lattice lines, and the lattice-mismatched portion includes a plurality of continuously unconnected lattice lines.

14. A magnetoresistance effect element comprising:

a first ferromagnetic metal layer;

a second ferromagnetic metal layer; and a tunnel barrier layer that is sandwiched between the first and second ferromagnetic metal layers, wherein the tunnel barrier layer is expressed by a composition formula of $AB_2O_x$ ($0<x\le4$), and has a spinel structure in which cations are arranged in a disordered manner, the tunnel barrier layer has a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer, A is a divalent cation of plural non-magnetic elements, an element having the largest ionic radius among elements included in the divalent cation of the non-magnetic element is included in a proportion of 12.5% to 90% in the divalent cation, and B is an aluminum ion.

15. The magnetoresistance effect element according to claim 14, wherein a volume ratio of the lattice-matched portion with respect to a volume of the entire tunnel barrier layer is 65% to 95%.

16. A magnetoresistance effect element comprising:

a first ferromagnetic metal layer;

a second ferromagnetic metal layer; and a tunnel barrier layer that is sandwiched between the first and second ferromagnetic metal layers, wherein the tunnel barrier layer is expressed by a composition formula of $AB_2O_x$ ($0<x\le4$), the tunnel barrier layer has a lattice-matched portion that is lattice-matched with both of the first ferromagnetic metal layer and the second ferromagnetic metal layer, and a lattice-mismatched portion that is not lattice-matched with at least one of the first ferromagnetic metal layer and the second ferromagnetic metal layer, the tunnel barrier layer has a spinel structure in which cations are arranged in a disordered manner, A in the composition formula includes a cation of plural non-magnetic elements, and B is an aluminum ion.

17. The magnetoresistance effect element according to claim 16, wherein a volume ratio of the lattice-matched portion with respect to a volume of the entire tunnel barrier layer is 65% to 95%.

* * * * *